United States Patent
Ranjan et al.

(10) Patent No.: US 8,456,897 B2
(45) Date of Patent: Jun. 4, 2013

(54) LOW COST MULTI-STATE MAGNETIC MEMORY

(75) Inventors: Rajiv Yadav Ranjan, San Jose, CA (US); Parviz Keshtbod, Los Altos Hills, CA (US); Roger Klas Malmhall, San Jose, CA (US)

(73) Assignee: Avalanche Technology, Inc., Fremont, CA (US)

( * ) Notice: Subject to any disclaimer, the term of this patent is extended or adjusted under 35 U.S.C. 154(b) by 1 day.

(21) Appl. No.: 13/216,997

(22) Filed: Aug. 24, 2011

(65) Prior Publication Data

US 2011/0305078 A1    Dec. 15, 2011

Related U.S. Application Data

(63) Continuation of application No. 11/860,467, filed on Sep. 24, 2007, now Pat. No. 8,018,011.

(51) Int. Cl.
*G11C 11/00* (2006.01)

(52) U.S. Cl.
USPC ............ 365/158; 365/148; 365/171; 365/173

(58) Field of Classification Search
USPC .................. 365/158, 148, 171, 173
See application file for complete search history.

(56) References Cited

U.S. PATENT DOCUMENTS

| | | | | |
|---|---|---|---|---|
| 7,099,186 | B1 * | 8/2006 | Braun | 365/158 |
| 7,154,771 | B2 * | 12/2006 | Braun | 365/158 |
| 7,200,033 | B2 * | 4/2007 | Braun et al. | 365/158 |
| 7,430,135 | B2 * | 9/2008 | Huai et al. | 365/158 |
| 7,894,248 | B2 * | 2/2011 | Yu et al. | 365/158 |

* cited by examiner

*Primary Examiner* — Pho M Luu
(74) *Attorney, Agent, or Firm* — Maryam Imam; IPxLaw Group LLP

(57) ABSTRACT

A multi-state current-switching magnetic memory element has a magnetic tunneling junction (MTJ), for storing more than one bit of information. The MTJ includes a fixed layer, a barrier layer, and a non-uniform free layer. In one embodiment, having 2 bits per cell, when one of four different levels of current is applied to the memory element, the applied current causes the non-uniform free layer of the MTJ to switch to one of four different magnetic states. The broad switching current distribution of the MTJ is a result of the broad grain size distribution of the non-uniform free layer.

5 Claims, 16 Drawing Sheets

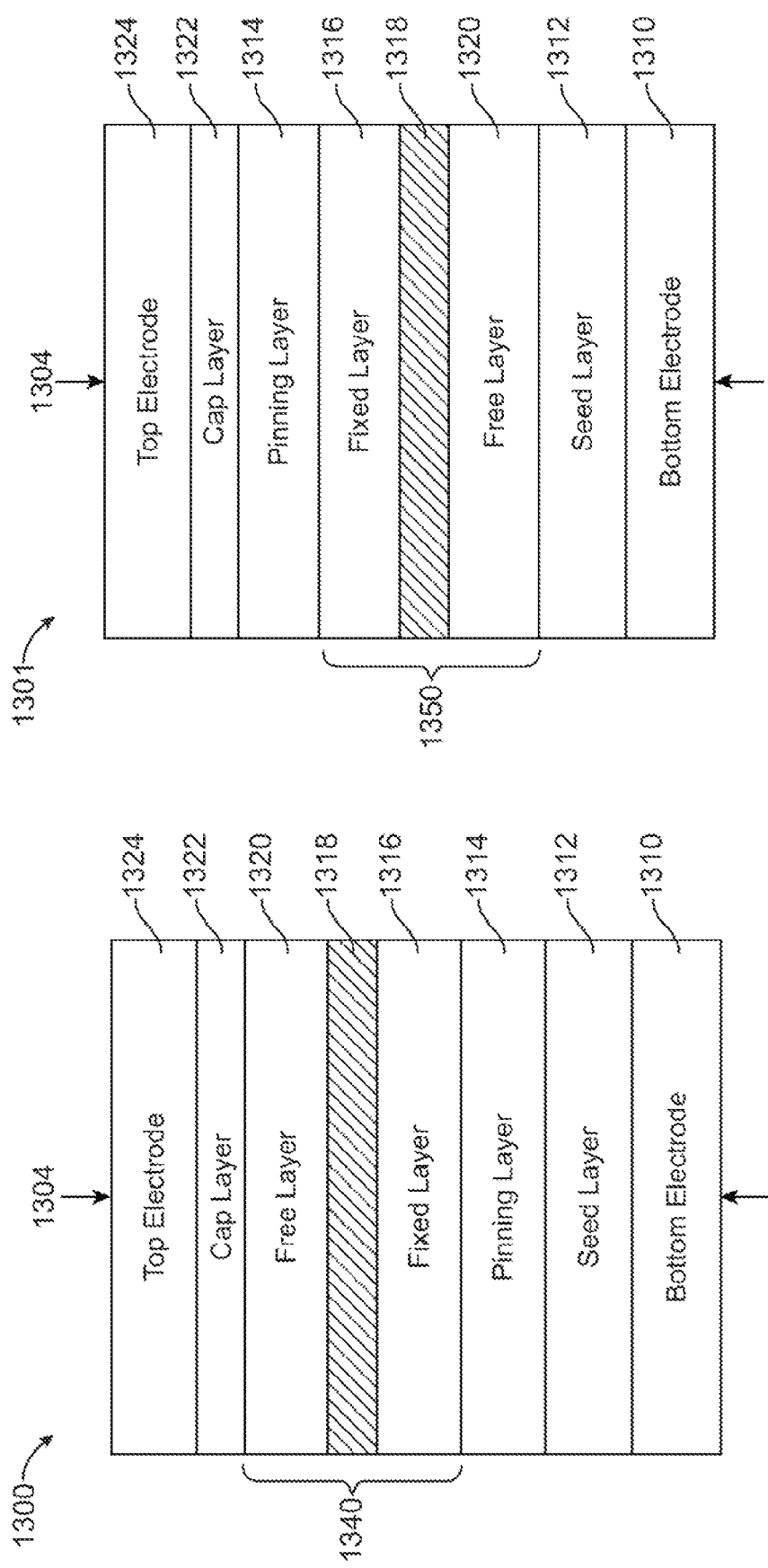

MLC cell with two or more stacked MTJ with different anisotrophy.

| I density | 100 | n= 2 | | Parallel | Anti-parallel |
|---|---|---|---|---|---|
| Anisotrophy ratio | | 2 | R(KΩ) large | 1 | 2 |
| | Large | Small | R(KΩ) small | 2 | 4 |

| Fixed layers | Free layer 1 | Free layer 2 | State | Total R | Prog I (uA) |
|---|---|---|---|---|---|
| → | → | → | 1 | 3 | 200 |
| → | → | ← | 2 | 5 | -50 |
| → | ← | ← | 3 | 6 | -200 |
| → | ← | → | 4 | 4 | 50 |

Table 1

FIG. 15

MLC cell with two or more MTJs side by side with different anisotrophy.

| I density | 50 | n= 2 | | Parallel | Anti-parallel |
|---|---|---|---|---|---|
| Anisotrophy ratio | | 1.3 | R(KΩ) large | 3 | 6 |
| | Small | Large | R(KΩ) small | 3.9 | 7.8 |

| Fixed layer | Free layer | Free layer | State | Total R | Prog I (uA) |
|---|---|---|---|---|---|
| → | → | → | 1 | 1.70 | -134.5 |
| → | → | ← | 2 | 2.36 | 50 |
| → | ← | ← | 3 | 3.39 | 134.5 |
| → | ← | → | 4 | 2.17 | -50 |

| From one state to another | 1 to 2 | 2 to 3 | 3 to 4 |
|---|---|---|---|
| R differences between different states | 0.67 | 1.03 | 1.22 | 0.47 |

Table 2

FIG. 16

|  | MgO Tunnel Size (nm) | Resistance of MTJ in Each State (in Ω) | | | |
| --- | --- | --- | --- | --- | --- |
|  |  | I(00) | II(01) | III(10) | IV(11) |
| Scenario 1 | 1.2 | 694 | 1038 | 1382 | 1736 |
| Scenario 2 | 1.44 | 1389 | 2214 | 3039 | 3889 |
| Scenario 3 | 1.6 | 2778 | 4611 | 6444 | 8333 |

Table 3

FIG. 17

| Applied Current (μA) | | | |
| --- | --- | --- | --- |
| 400 | -200 | -300 | -400 |

| Free Layer | ----→ | --▶ ◀-- | --▶ ◀-- | ◀----- |
| --- | --- | --- | --- | --- |
| Fixed Layer | ----→ | -----▶ | -----▶ | -----▶ |

| State | I | II | III | IV |
| --- | --- | --- | --- | --- |
|  | 00 | 01 | 10 | 11 |

Table 4

FIG. 18

|  | Switching Currents (μA) | | |
| --- | --- | --- | --- |
|  | I sw1 | I sw2 | I sw3 |
| 60 × 120nm MTJ | 80 | 120 | 160 |
| 100 × 150nm MTJ | 100 | 200 | 300 |

Table 5

FIG. 19

LOW COST MULTI-STATE MAGNETIC MEMORY

CROSS REFERENCE TO RELATED APPLICATION

This application is a continuation application of U.S. patent application Ser. No. 11/860,467, filed on Sep. 24, 2007, and entitled "A Low Cost Multi-State Magnetic Memory", which is a continuation-in-part of U.S. patent application Ser. No. 11/678515, entitled "A High Capacity Low Cost Multi-State Magnetic Memory," filed Feb. 23, 2007, which was a continuation-in-part of U.S. patent application Ser. No. 11/674,124, entitled "Non-Uniform Switching Based on Non-Volatile Magnetic Base Memory," filed Feb. 12, 2007, the disclosures of which are incorporated herein by reference, as though set forth in full.

BACKGROUND OF THE INVENTION

1. Field of the Invention

The present invention relates generally to non-volatile magnetic memory and particularly to multi-state magnetic memory.

2. Description of the Prior Art

Computers conventionally use rotating magnetic media, such as hard disk drives (HDDs), for data storage. Though widely used and commonly accepted, such media suffer from a variety of deficiencies, such as access latency, higher power dissipation, large physical size and inability to withstand any physical shock. Thus, there is a need for a new type of storage device devoid of such drawbacks.

Other dominant storage devices are dynamic random access memory (DRAM) and static RAM (SRAM), which are volatile and very costly but have fast random read/write access time. Solid state storage, such as solid-state-nonvolatile-memory (SSNVM) devices having memory structures made of NOR/NAND-based Flash memory, providing fast access time, increased input/output (IOP) speed, decreased power dissipation and physical size and increased reliability but at a higher cost which tends to be generally multiple times higher than hard disk drives (HDDs).

Although NAND-based Flash memory is more costly than magnetic hard disk drives, it has replaced HDDs in many applications such as digital cameras, MP3-players, cell phones, and hand held multimedia devices due, at least in part, to its characteristic of being able to retain data even when power is disconnected. However, as memory dimension requirements are dictating decreased sizes, scalability is becoming an issue because the designs of NAND-based Flash memory and DRAM memory are becoming difficult to scale with smaller dimensions. For example, NAND-based Flash memory has issues related to capacitive coupling, few electrons/bit, poor error-rate performance and reduced reliability due to decreased read-write endurance. Read-write endurance refers to the number of reading, writing and erase cycles before the memory starts to degrade in performance due primarily to the high voltages required in the program, erase cycles.

It is believed that NAND Flash, especially multi-bit designs thereof, would be extremely difficult to scale below 45 nanometers. Likewise, DRAM has issues related to scaling of the trench capacitors leading to very complex designs that are becoming increasingly difficult to manufacture, leading to higher cost.

Currently, applications commonly employ combinations of EEPROM/NOR, NAND, HDD, and DRAM as a part of the memory in a system design. Design of different memory technology in a product adds to design complexity, time to market and increased costs. For example, in hand-held multimedia applications incorporating various memory technologies, such as NAND Flash, DRAM and EEPROM/NOR Flash memory, complexity of design is increased as are manufacturing costs and time to market. Another disadvantage is the increase in size of a device that incorporates all of these types of memories therein.

There has been an extensive effort in development of alternative technologies such as Ovanic RAM (or phase-change memory), Ferromagnetic RAM (FeRAM), Magnetic RAM (MRAM), Nanochip, and others to replace memories used in current designs such as DRAM, SRAM, EEPROM/NOR Flash, NAND Flash and HDD in one form or another. Although these various memory/storage technologies have created many challenges, there have been advances made in this field in recent years. MRAM seems to lead the way in terms of its progress in the past few years to replace all types of memories in the system as a universal memory solution.

One of the problems with prior art memory structures is that the current and power requirements are too high to make a functional memory device or cell. This also poses a key concern regarding the reliability of such devices due to likely dielectric breakdown of the tunneling barrier layer and thereby making it non-functional.

The challenge with other prior art techniques has been that the switching current is too high to allow the making of a functional device for memory applications due to the memory's high power consumption. Several recent publications, such as those cited below as references 5 and 6[5,6] have shown that the switching current can be reduced by having the memory element pinned by two anti-ferromagnetic (AF)-coupled layers resulting in spin oscillations or "pumping" and thereby reducing the switching current.

An additionally known problem is using magnetic memory to store more than two states therein. To this end, multi-level or multi-state magnetic memory cells or elements for storing more than one bit of information do not exist.

What is needed is magnetic memory for storing more than one bit of digital information.

SUMMARY OF THE INVENTION

To overcome the limitations in the prior art described above, and to overcome other limitations that will become apparent upon reading and understanding the present specification, the present invention discloses a method and a corresponding structure for a magnetic storage memory device that is based on current-induced-magnetization-switching having reduced switching current in the magnetic memory.

Briefly, an embodiment of the present invention includes a multi-state current-switching magnetic memory element having a magnetic tunneling junction (MTJ), for storing more than one bit of information. The MTJ includes a fixed layer, a barrier layer, and a non-uniform free layer. In one embodiment, having 2 bits per cell, when one of four different levels of current is applied to the memory element, the applied current causes the non-uniform free layer of the MTJ to switch to one of four different magnetic states. The broad switching current distribution of the MTJ is a result of the broad grain size distribution of the non-uniform free layer.

These and other objects and advantages of the present invention will no doubt become apparent to those skilled in the art after having read the following detailed description of the preferred embodiments illustrated in the several figures of the drawing.

IN THE DRAWINGS

Figure 3:
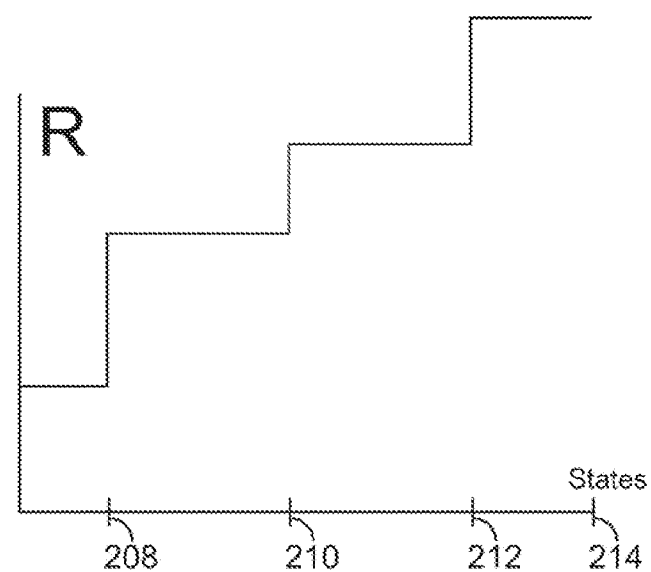

FIG. 3 shows a graph of the level of resistance (R) of each of the layers 118, 114, 110 and 106 (shown in the y-axis) vs the state of the memory element 100.

Figure 4:
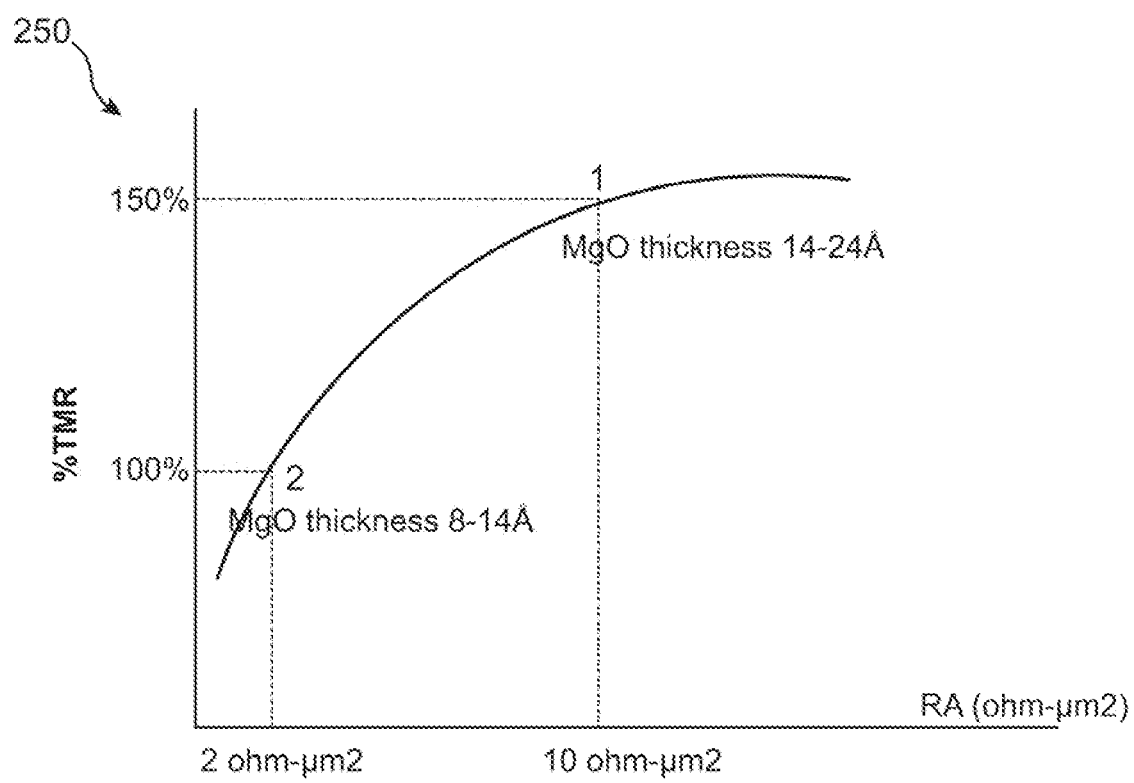
Figure 5:
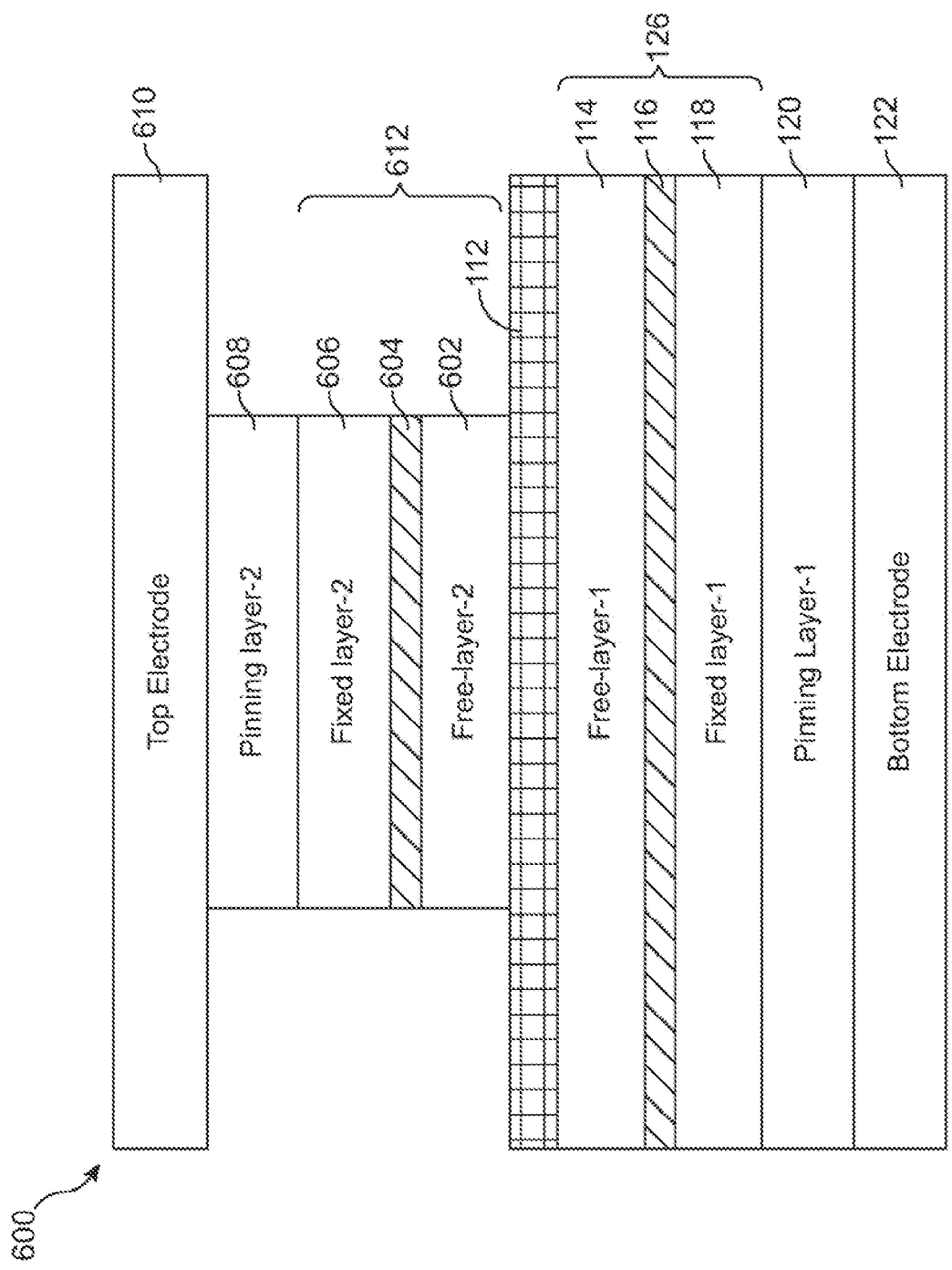

FIG. 4 shows a graph 250 of the tunneling magneto resistance (TMR), shown in the y-axis, vs the resistance area (RA)FIG. 5 shows.

FIG. 5 shows relevant layers of a multi-state current-switching magnetic memory element 600 are shown, in accordance with another embodiment of the present invention.

Figure 6:
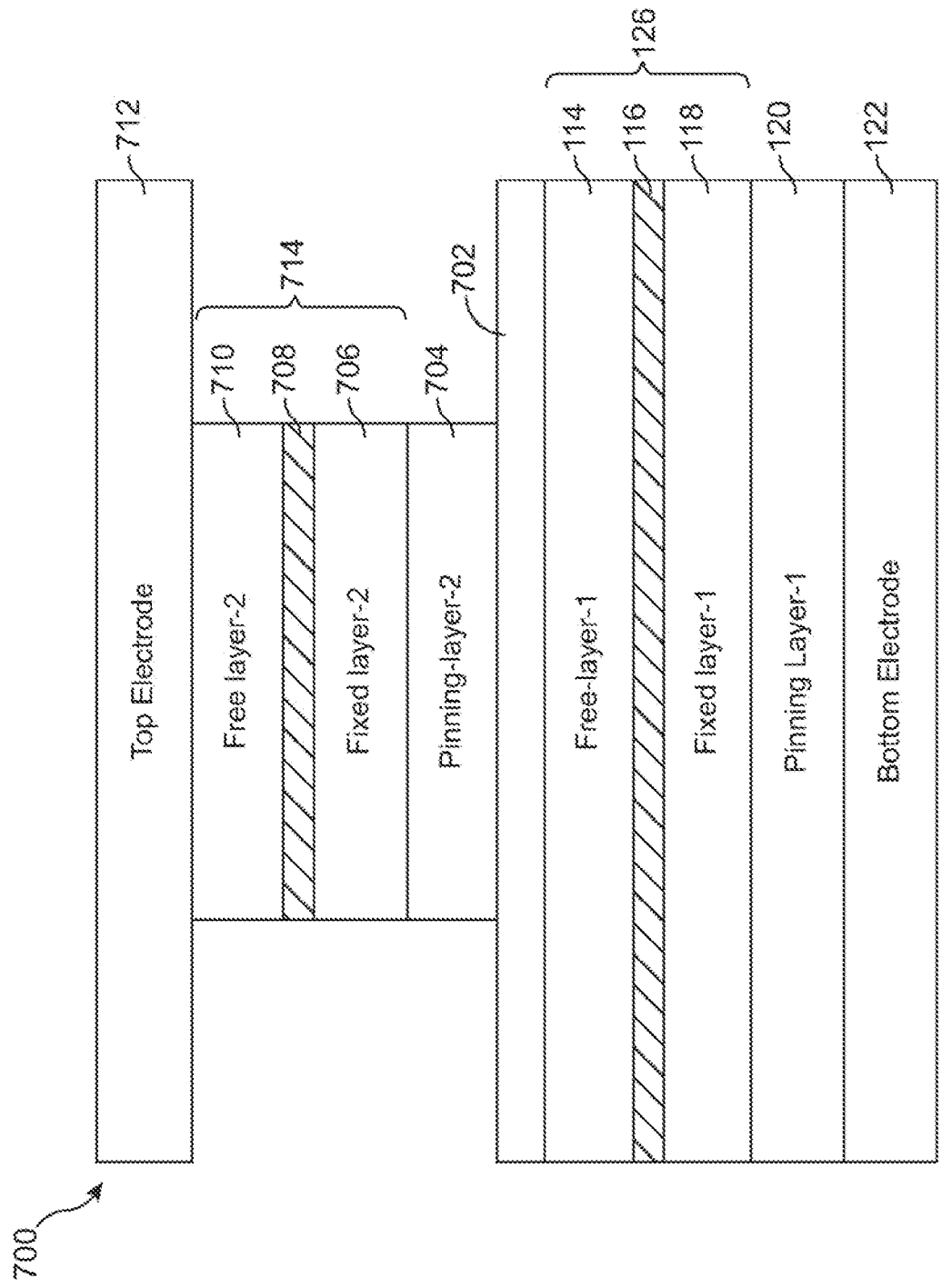

FIG. 6 shows relevant layers of a multi-state current-switching magnetic memory element 700, in accordance with yet another embodiment of the present invention.

Figure 7:
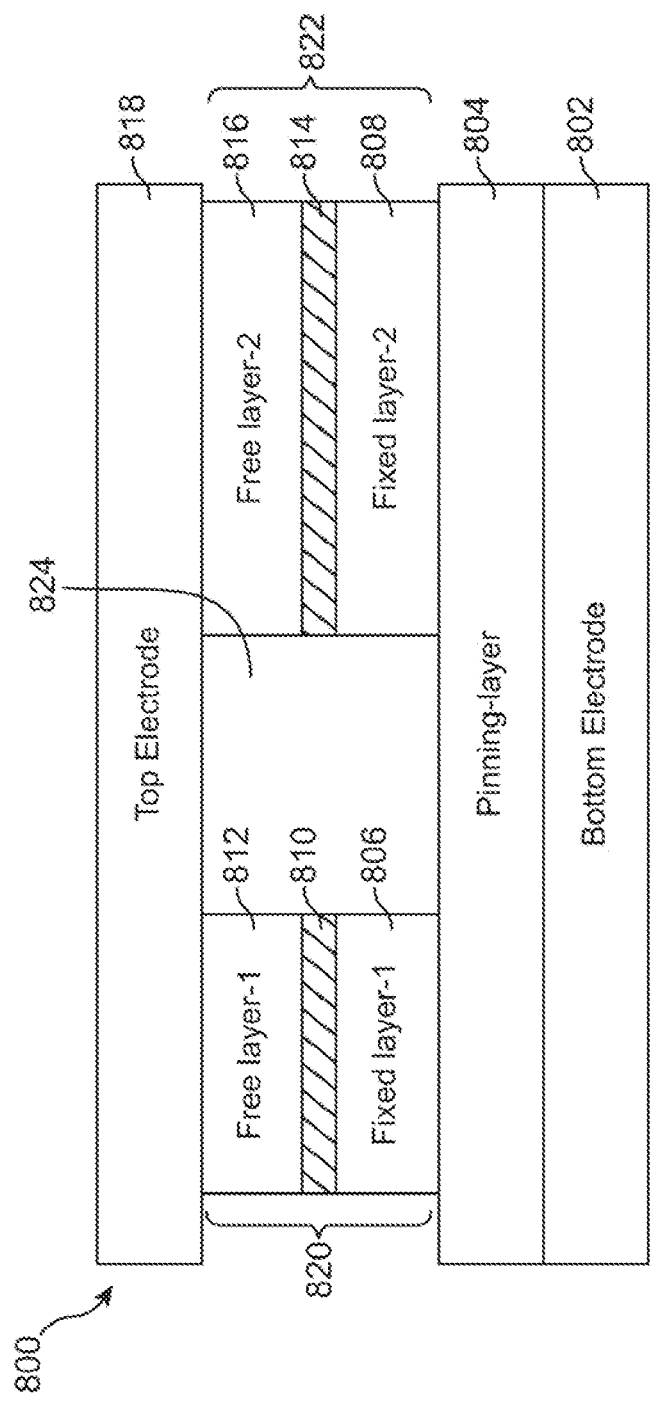

FIG. 7 shows relevant layers of a multi-state current-switching magnetic memory element 800, in accordance with still another embodiment of the present invention.

Figure 8:
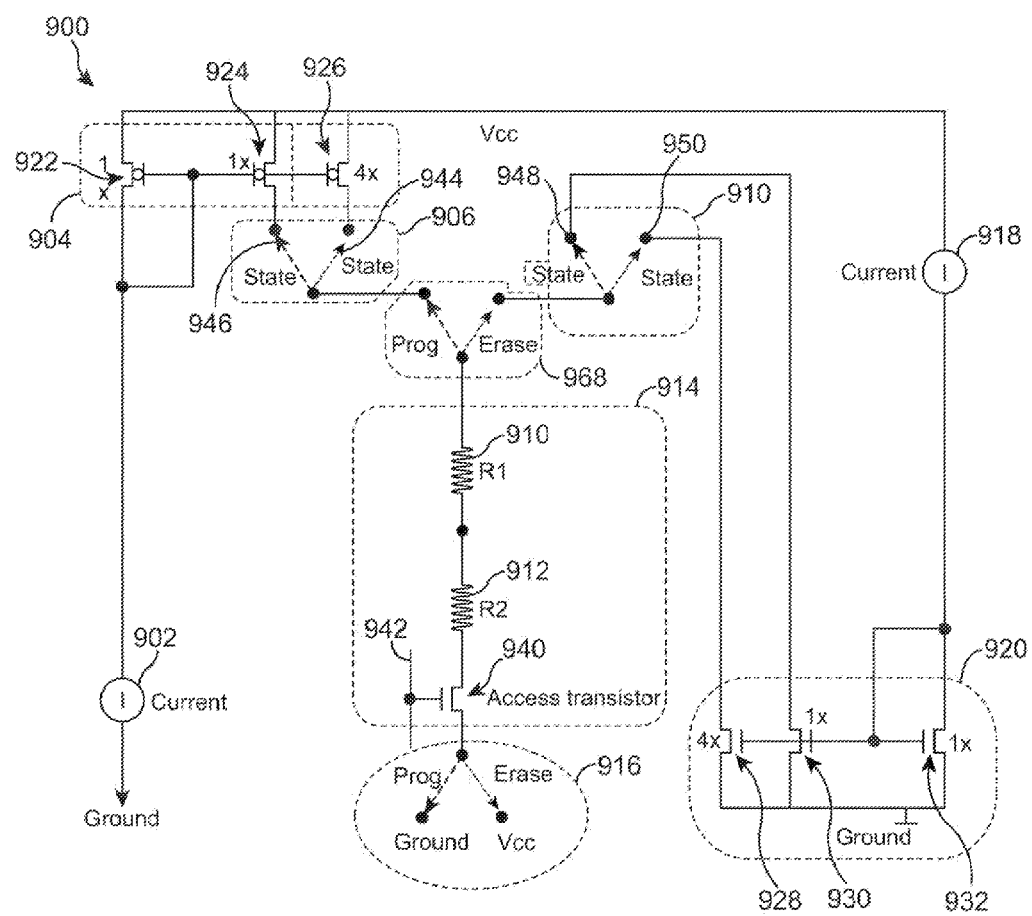

FIG. 8 shows a program/erase circuit for programming and/or erasing the memory elements of the various embodiments of the present invention.

Figure 9:
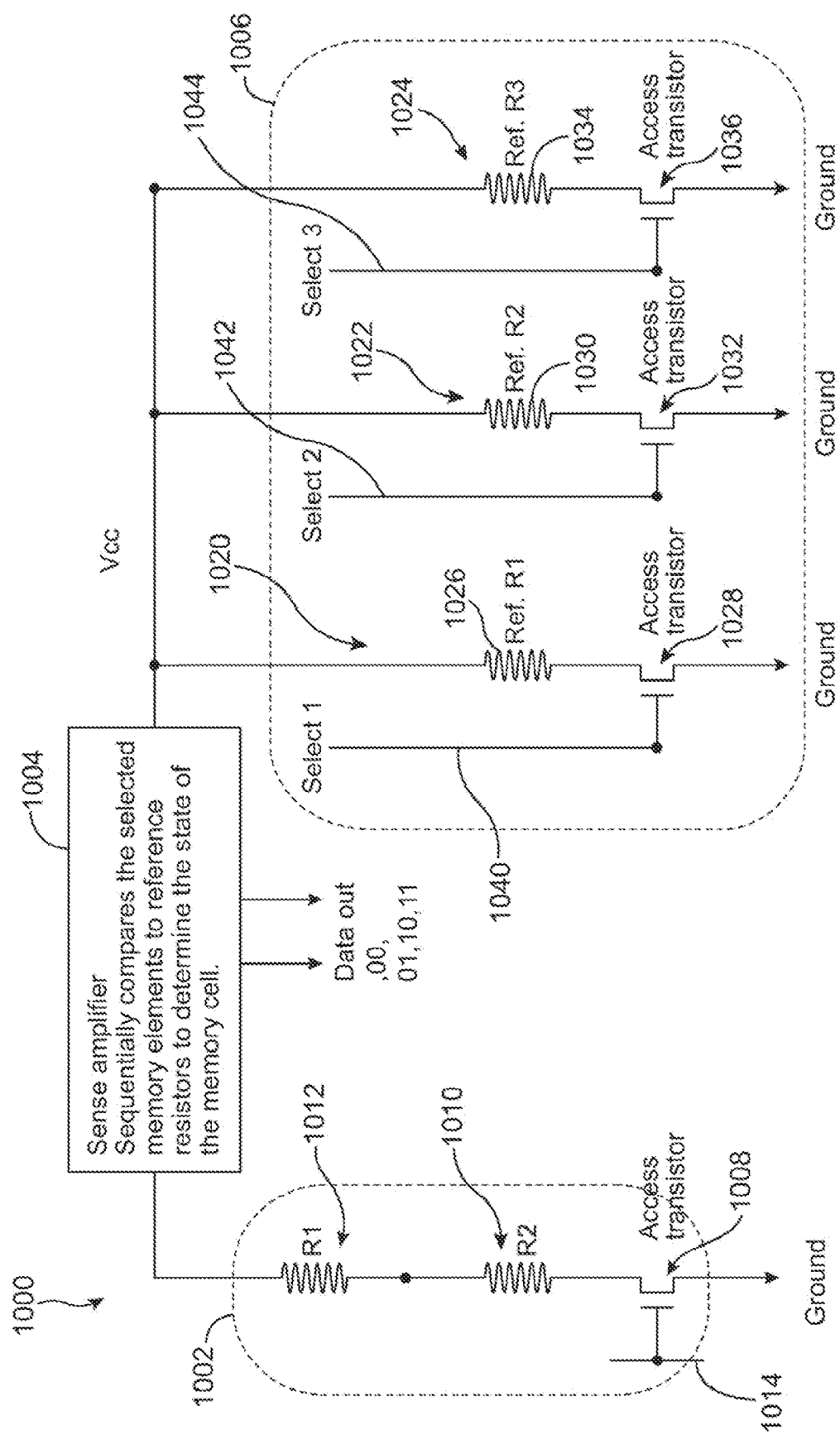

FIG. 9 shows a read circuit for reading the memory elements of the various embodiments of the present invention.

FIGS. 10(a) and (b) shows two possible stack configurations of an embodiment of the present invention.

Figure 11A:
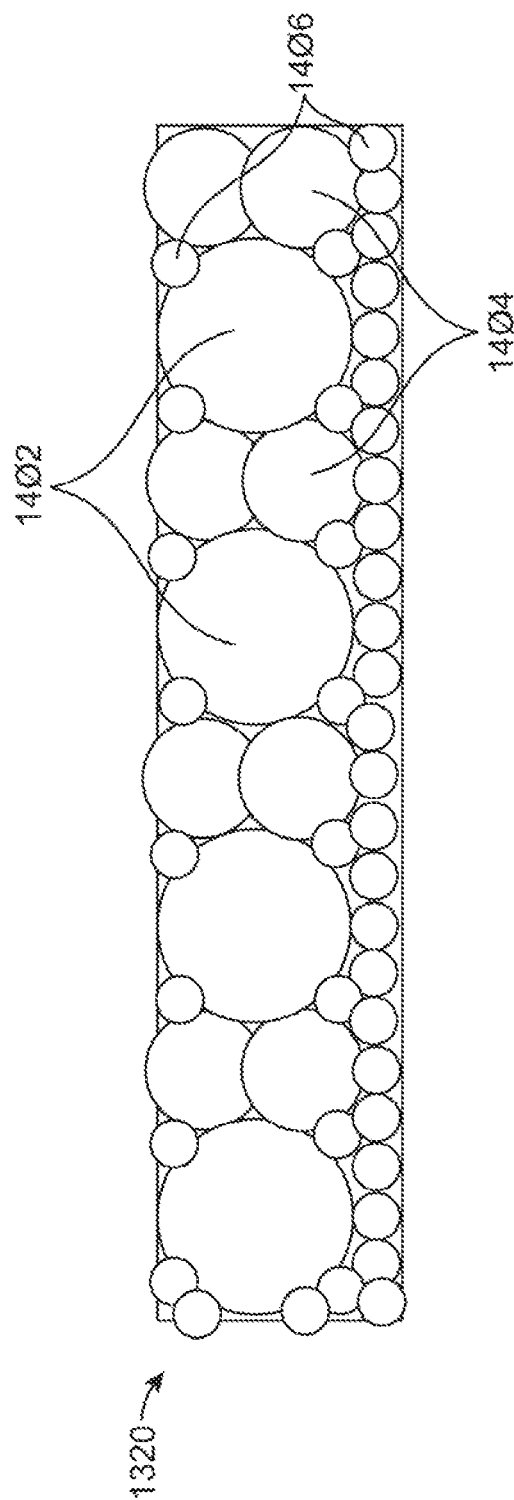

FIGS. 11(a) and (b) show a detailed cross-sectional view of non-uniform free layer 1320 in an embodiment of the present invention.

Figure 12:
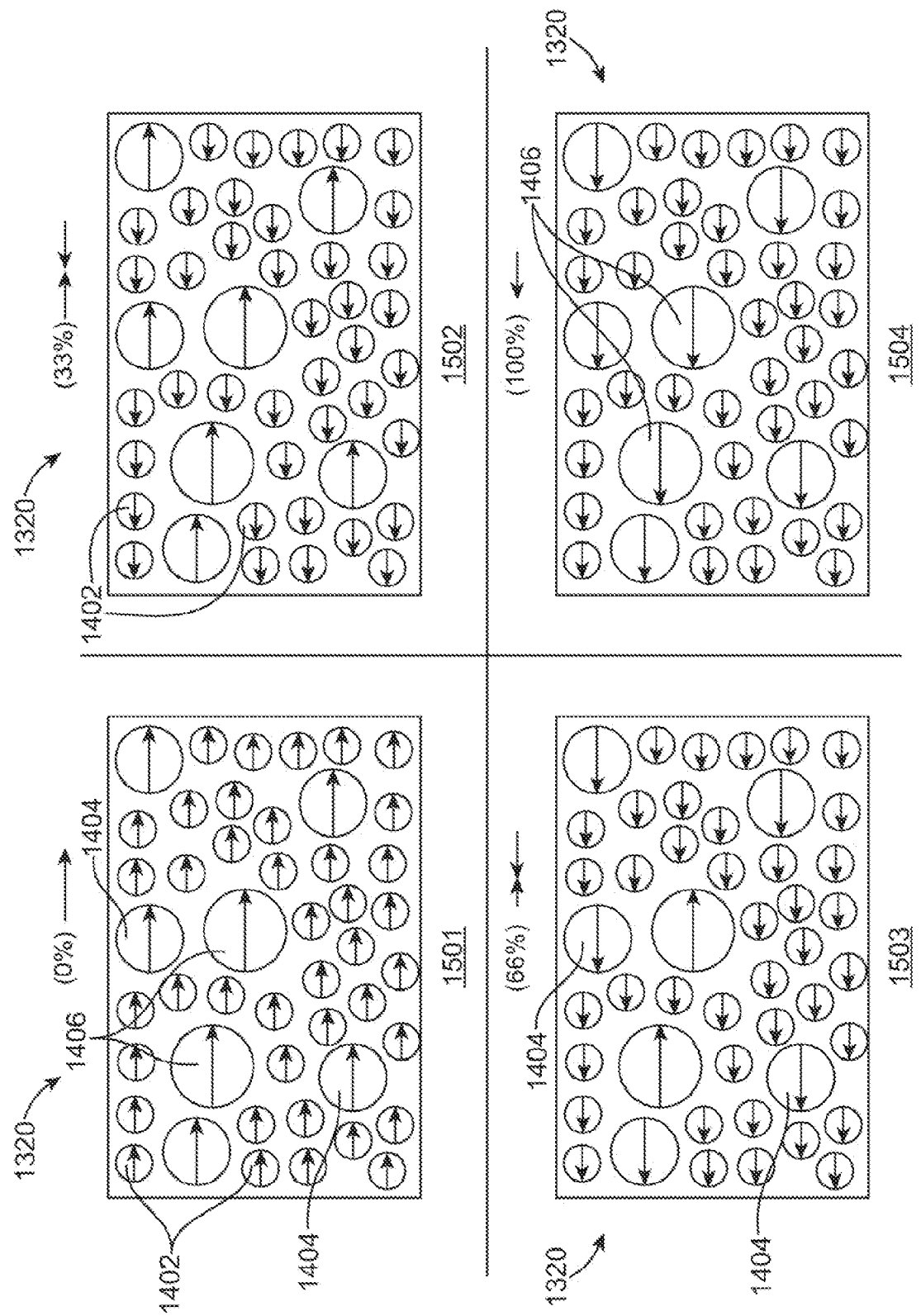

FIG. 12 shows various illustrative views of the magnetization state of the magnetic grains of a memory element.

Figure 13:
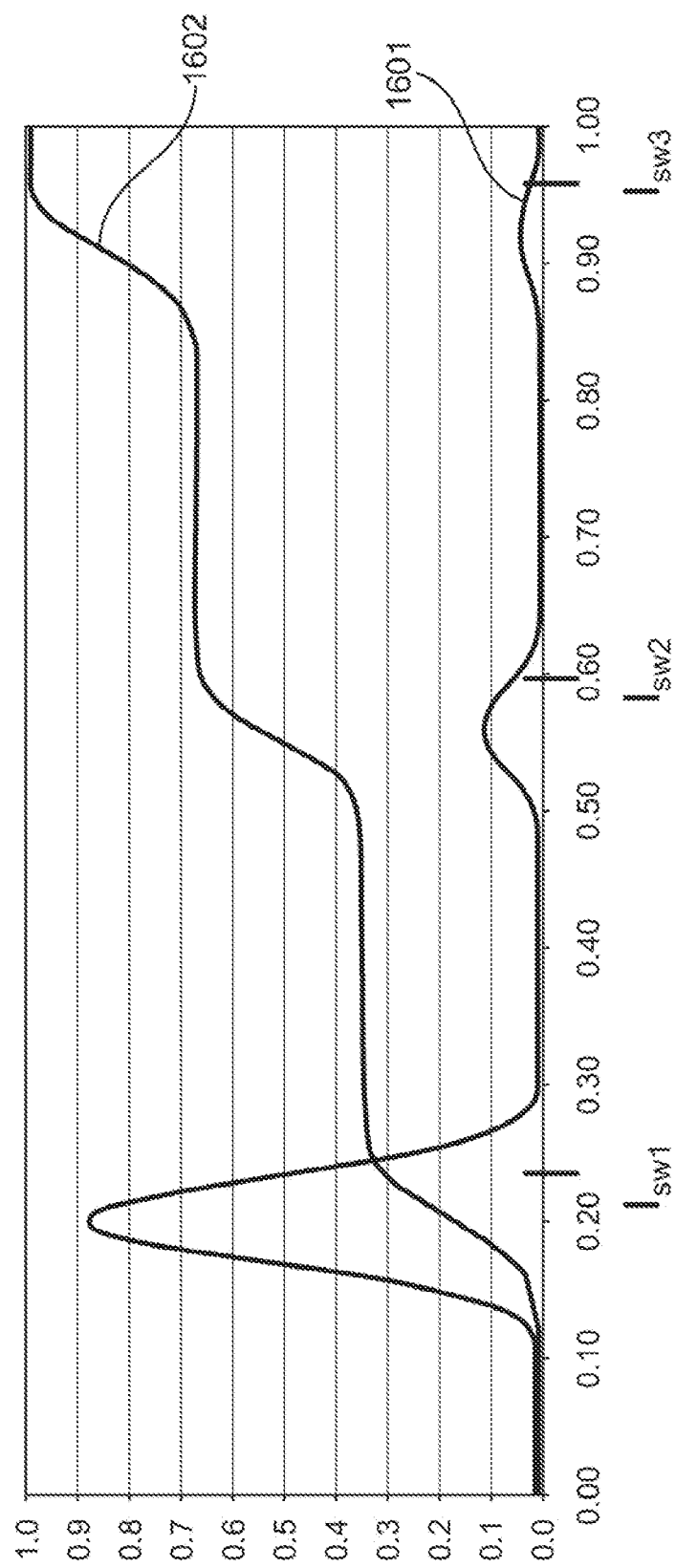

FIG. 13 shows a graph of the flipped magnetic moments of a non-uniform free layer as a function of the applied switching current of an embodiment of the present invention.

Figure 14:
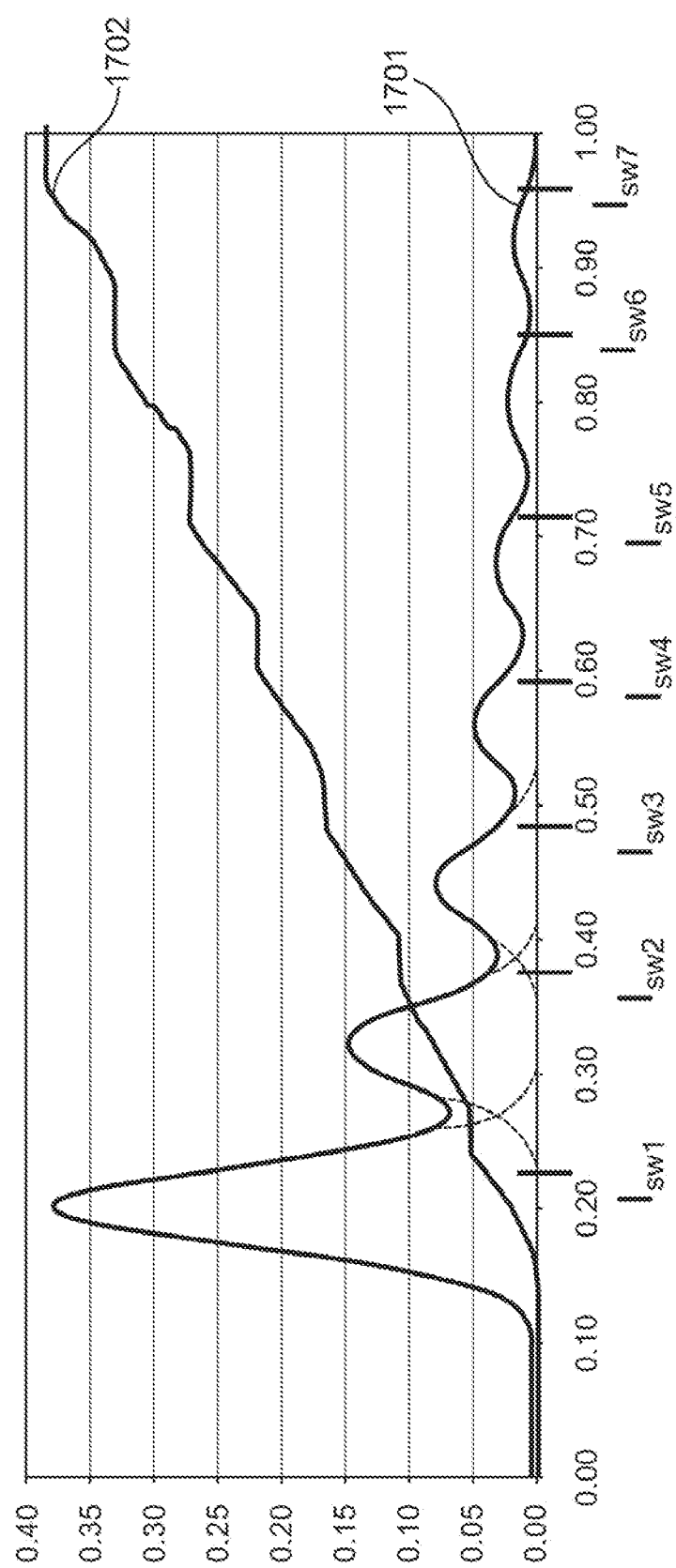

FIG. 14 shows a graph of grain size distribution and switching current distribution resulting in 8 states, of an alternative embodiment of the present invention.

Figure 1:
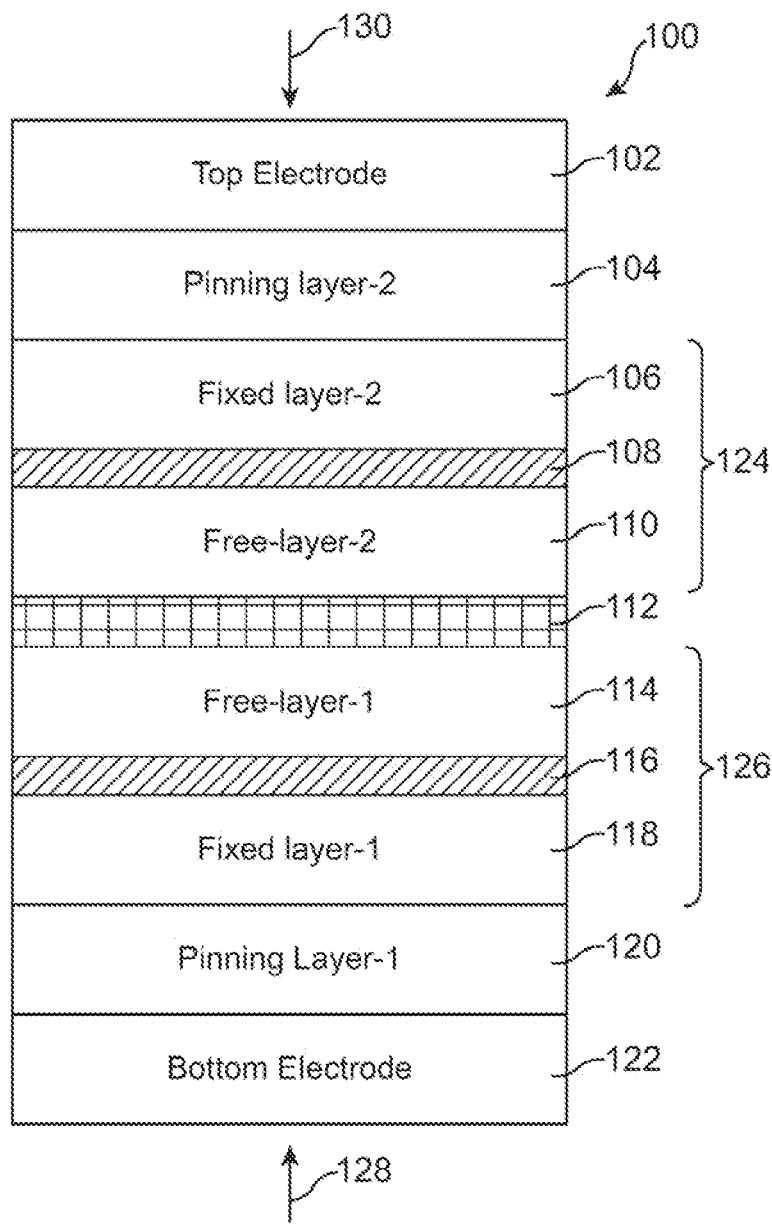
FIG. 1 shows relevant layers of a multi-state current-switching magnetic memory element 100 are shown, in accordance with an embodiment of the present invention.

FIG. 15 shows Table 1 shows certain exemplary characteristics of the embodiments of FIGS. 1, 5 and 6.

FIG. 16 shows Table 2 shows certain exemplary characteristics of the embodiment of FIG 7.

FIG. 17 shows Table 3, which shows how the resistance of a stack, in all four states, changes as a function of the thickness of the barrier layer in an embodiment of the present invention.

FIG. 18 shows Table 4, which shows how the state of the magnetic moment of the non-uniform free layer changes as a function of the current applied to the stack at any given time, in an embodiment of the present invention.

FIG. 19 shows Table 5, which shows how the switching current of a given stack is a function of the size of the footprint of the stack in an embodiment of the present invention.

DETAILED DESCRIPTION OF THE PREFERRED EMBODIMENT

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the present invention. It should be noted that the figures discussed herein are not drawn to scale and thicknesses of lines are not indicative of actual sizes.

In an embodiment of the present invention, a non-volatile magnetic memory element is disclosed. In one embodiment of the present invention, the memory element includes a non-uniform free layer, a barrier layer, and fixed layer among a plurality of layers; the non-uniform free layer, barrier layer, and fixed layer together comprise a magnetic tunneling junction (MTJ). In the following descriptions, each memory element is comprised of a single MTJ; but, in other embodiments, MTJs could be "stacked" upon each other in a single memory element, in order to increase memory storage.

Abstractly, the MTJ of the non-volatile magnetic memory element represents a binary value, the binary value dependent upon the direction of the magnetic moments of the MTJs' free and fixed layers in respect to each other. While powered on, the MTJ is in one of four states at any given time, each having a unique pair of magnetic moments. These states—'I', 'II', 'III', and 'IV'—correspond to binary '00', '01', '10', and '11' respectively. At any given moment, the state of the MTJ is a function of the current last applied to the memory element; and the electrical resistance, at any given moment, of an MTJ is a function of the state it is in. Thus, each MTJ also has four unique resistance values, which can be read to determine the contents, in binary format, of the MTJ.

Referring now to FIG. 1, relevant layers of a multi-state current-switching magnetic memory element 100 are shown, in accordance with an embodiment of the present invention. The memory element 100 is shown to include a bottom electrode 122 on top of which is shown formed a pinning layer 120 on top of which is shown formed a fixed layer 118, on top of which is shown formed a barrier layer 116, on top of which is formed a free layer 114, on top of which is shown formed a non-magnetic layer 112, on top of which is shown formed a free layer 110, on top of which is shown formed a barrier layer 108, on top of which is shown formed a fixed layer 106, on top of which is shown formed a pinning layer 104, on top of which is shown formed a top electrode 102. The top electrode 102 and the bottom electrode 122 are each made of Tantalum (Ta) in an exemplary embodiment although other suitable materials are contemplated. The layers 114, 116 and 118 are shown to form a MTJ 126 separated by the layer 112 from an MTJ 124, which is formed from the layers 106, 108 and 110. The MTJ 124 and 126 form the relevant parts of a stack of memory elements. In fact, while two MTJs are shown to form the stack of FIG. 1, other number of MTJs may be stacked for storing additional bits of information.

In FIG. 1, the MTJ 126 is for storing a bit of information or two states, '1' and '0', while the MTJ 124 is for storing another bit of information and since each bit represents two binary states, i.e. '1' and '0', two bits represent four binary states, generally represented as '00', '01', '10', '11', or 0, 1, 2 and 3 in decimal notation, respectively. The memory element 100 advantageously stores two bits of information thereby decreasing the real estate dedicated for memory and further increases system performance. This is particularly attractive for embedded memory applications. Additionally, manufacturing is made easier and less costly and scalability is realized.

In FIG. 1, the barrier layers of each of the MTJs, such as the layer 116 acts as a filter for electrons with different spins giving rise to different amounts of tunneling current for electrons with different spins thereby causing two unique resistance values associated with each MTJ for two different orientations of the free layer. In the case where additional MTJs are employed, each MTJ similarly has associated therewith, a unique resistance value.

In one embodiment of the present invention, the thickness of the layers 108 and 116 to cause the MTJs 124 and 126 to have different resistances and therefore capable of storing more than one bit.

Examples of materials used to form each of the layers of the memory element 100 will now be presented. It should be noted that these materials are merely examples and other types of materials may be employed. The layers 104 and 122, are each typically formed substantially of IrMn or PtMn or NiMn or any other material including Manganese (Mn). The layers 106 and 120 are typically formed substantially of a magnetic material. Examples of such magnetic material include CoFeB or CoFe/Ru/CoFeB. The layers 108 and 116 are each made substantially of a non-magnetic material, an example of which is magnesium oxide (MgO). The layer 112 is a non-magnetic layer made substantially of, for example, NiNb, NiP, NiV or CuZr. The layer 112 serves to insulate the two MTJs 124 and 126 from one another. In an embodiment employing more than two MTJs, another layer, such as the layer 112 would be formed on top of the layer 104 or on the bottom of the layer 120. The layers 110 and 114 are each made of CoFeB containing oxides intermixed. The layers 110 and 114 are substantially amorphous in an at-deposited state. The top electrode 102 and the bottom electrode 122 are each made of tantalum (Ta), in one embodiment of the present invention, however, other types of conductive material may be employed.

The layers 120 and 104 are anti-ferromagnetic (AF) coupling layers. More specifically, for example, the magnetic moment of the layer 104 helps to pin the magnetic moment of the layer 106. Similarly, the magnetic moment of the layer 120 serves to pin the magnetic moment of the layer 118. The magnetic moment of each of the layers 120 and 104 are permanently fixed.

Other choices of material for the layers 108 and 166 are aluminum oxide(Al2O3) and titanium oxide(TiO2). A thin-layer of one of the constituent elements may be deposited prior to the deposition of the barrier oxide layer. For example, a 2-5 A thick Mg layer may be deposited prior to the deposition of the layers 108 and 116. This limits any damage of the magnetic- free layer from intermixing of the elements during deposition. The layer 112 is a non-magnetic layer which is substantially amorphous made of, for example, Nickel niobium(NiNb), Nickel phosphorous(NiP), Nickel vanadium (NiV), Nickel boron(NiB) or copper-zirconium(CuZr). It should be noted that the composition of these alloys is chosen in such a way that the resulting alloy becomes substantially amorphous, for example, for nickel niobium(NiNb), the typical Nb content is maintained between 30 to 70 atomic percent and for nickel phosphorous(NiP) the phosphorous(P) content is maintained between 12 and 30 atomic percent. The layer 112 serves to isolate the two MTJs 124 and 126 from one another. In an embodiment of the present invention, which employs more than two MTJs, another layer, such as the layer 112 would be formed on top of the layer 104 or on the bottom of the layer 120. The layers 110 and 114 are each made of CoFeB containing oxides intermixed. The layers 110 and 114 are substantially amorphous in an as-deposited state. The top and the bottom electrodes are typically made of tantalum(Ta).

The layers 120 and 104 are anti-ferromagnetic (AF) coupling layers. More specifically, for example, the magnetic moment of the layer 104 helps to pin the magnetic moment of the layer 106. Similarly, the magnetic moment of the layer 120 serves to pin the magnetic moment of the layer 118. The magnetic moment of each of the layers 120 and 104 are permanently fixed. This is typically done by a magnetic annealing process following the deposition of all the layers and involves heating the whole wafer under the application of a substantially uni-axial magnetic field of 0ver 5 kilo-oersted and a temperature of over 350 degree centigrade for typically 2 hours. This annealing process also serves to re-crystalize the layers 108 and 116 and their respective adjacent free layers 110 and 114. This process is essential for making high performing magnetic tunnel junction.

Typical thicknesses for each of the layers of the memory element 100 are now presented. However, these sizes are merely examples, as other thicknesses are anticipated. A typical thickness of each of the top electrode 102 and the bottom electrode 122 is 30 to 200 nm. While a preferred thickness is typically 50 nm, the actual thickness choice may depend on the requirements from the metallization process. The layers 104 and 120 are typically 20 to 100 nm in thickness with a preferred thickness of 25-50 nm. The layers 108 and 118 are typically made of three layers of Cobalt-Iron(CoFe)/Ruthenium(Ru)/Cobalt-Iron-Boron(CoFeB) with CoFe layer being placed adjacent to the layers 104 and 120. The typical thickness of the CoFe layer is 3 to 10 nm, Ru layer is 0.6 to 1.0 nm to create anti-ferromagnetic coupling between the two adjacent magnetic layers of CoFe and CoFeB. The CoFeB layer is typically 2 to 10 nm thick with a preferred range of 25 to 5 nm. The free layers 110 and 114 are typically 2 to 7 nm thick with a preferred range of 2-5 nm and may contain a 1-2 nm thick layer of Co-Fe-oxide inter-dispersed in that layer in order to get low switching current during current induced switching. The barrier layers 108 and 116 are typically 0.8 to 3 nm. It is very likely that the two barrier layers may have slightly different thickness, for example layer 116 can be 1.5 to 2.5 nm thick while the second barrier layer 108 may be 0.8 to 1.2 nm thick, and vice-versa. Additionally, the thickness and the amounts of oxide in the free-layers 110 and 114 may be different by a factor of 1.5 or higher. The amorphous isolation layer 112 is typically 2 to 50 nm thick with a preferred range being 2 to 10 nm. It should be pointed out that while the most preferred choice of the non-magnetic isolation layer is amorphous non-magnetic alloys, a crystalline non-magnetic alloy may also work.

During manufacturing, the layers of the memory element 100 are formed in the manner described hereinabove. Additionally, an annealing process, which is well known, is performed heating the memory element 100 in the presence of a magnetic field after which channels are formed in each of the layers 108 and 116. Following the annealing process, the fix layers are oriented in a particular orientation and the layers 108 and 116 as well as the layers 110 and 114 take on a crystalline characteristic.

During operation, current is applied, in a perpendicular direction relative to the plane of the paper of FIG. 1, either from a direction indicated by the arrow 128 or a direction indicated by the arrow 130. When current is applied, depending on the level of current, the magnetic moment of the layers 110 and 114 are each caused to be switched to an opposite direction, or not. Since the MTJs 124 and 126 are made with different aspect ratios (or anisotropy), the switching current is different for these two MTJs. For example, in one embodiment of the present invention, the aspect ratio for MTJ 124 is approximately 1:1.3 to 1:1.5 while the aspect ratio for the MTJ 126 is approximately 1:2 to 1:2.5. Therefore, the switching current for the MTJ 126 is 3-5 times higher than that of the MTJ 124, in the foregoing embodiment. At high current levels both MTJs switch magnetic orientation, while at low current levels only the MTJ 124 having the smaller aspect ratio switches.

The state of the magnetic moment of each of the layers of the MTJ defines the state of the memory element 100. As the layers 104 and 120 each act as AF coupling layers, they pin or switch the magnetic moments of the their neighboring fixed layer, which, then, by the application of current, causes neighboring free layers to switch or not. More specifically, the layer 118 defines one state, the layer 114 defines another state, the layer 110 defines yet another state and the layer 106 defines still another state. For the sake of understanding, the states of each of the layers 118, 114, 110 and 106 are referred to as states 1, 2, 3 and 4, respectively.

Figure 2:
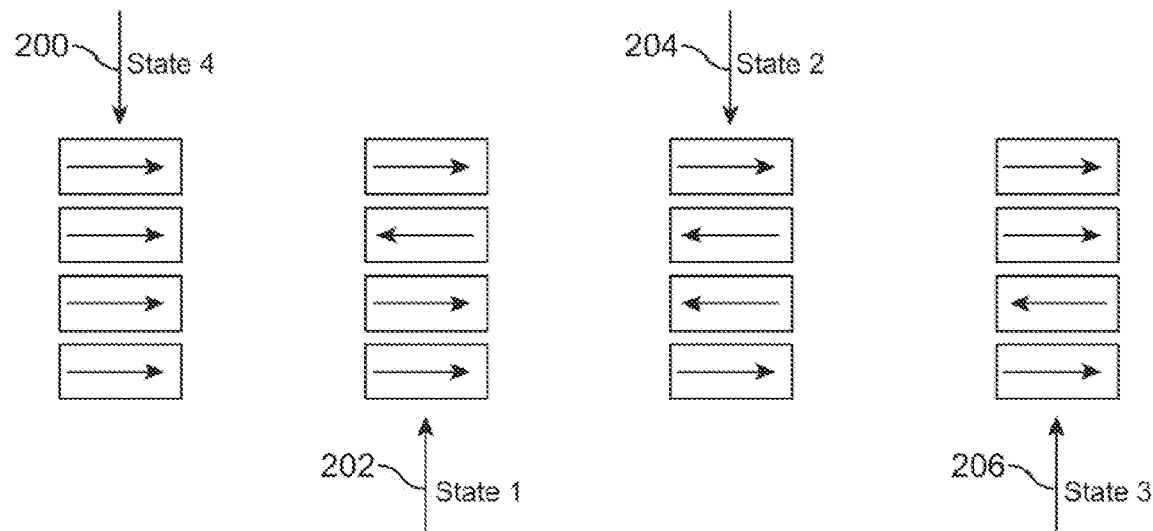
FIG. 2 shows various states of the memory element 100.

FIG. 2 shows various states of the memory element 100. Due to the use of two MTJs, four different states or two bits may be stored, therefore, the states 1-4 are shown. At each state, the directions of the arrows indicate the direction of the magnetic moments of free layers and pinning layers. The direction of the arrow 200 shows the direction of high current applied to the memory element 100 and in this case, the state of the memory element 100 is at an all '1's or all '0's state The direction of the arrow 202 shows the direction of low current applied to the memory element 100 when at state 1. The direction of the arrow 204 shows the direction of high current applied to the memory element 100 when the latter is at state 2 and the direction of the arrow 206 shows the direction of low current applied to the memory element 100 when at state 3.

FIG. 3 shows a graph of the level of resistance (R) of each of the layers 118, 114, 110 and 106 (shown in the y-axis) vs the state of the memory element 100. Thus, at, for example, at 208, the memory element 100 has taken on the state 1 (corresponding to 200 on FIG. 2), at 210, the memory element 100 has taken on the state 2 (corresponding to 202 on FIG. 2), at 212, the memory element 100 has taken on the state 3 (corresponding to 206 on FIG. 2), and at 214, the memory element 100 has taken on the state 4 (corresponding to 204 on FIG. 2). The level of resistance for each of these states is indicated in Table 1, at a column labeled "Total R". For example, at state 1, the R, in FIG. 3 is indicated as being 3 kilo ohms (K Ohms) by Table 1. At state 2, the R, in FIG. 3, is indicated as being 4 K Ohms and so on. The values used for resistance serve as examples only such that other values may be employed without departing from the scope and spirit of the present invention.

It should be noted that different aspect ratio or anisotropy associated with the different MTJs 124 and 126 causes the different switching of the MTJs, which results in two bits being stored in the memory element 100. In other embodiments, some of which will be shortly presented and discussed, the size of the barrier layers of the MTJs are changed to effectuate different resistances. In yet other embodiments, the size of the MTJs are changed to the same.

FIG. 4 shows a graph 250 of the tunneling magneto resistance (TMR), shown in the y-axis, vs. the resistance area (RA). The TMR is defined as:

$$TMR = (Rh - Rl)/Rl \quad \text{Eq (1)}$$

Wherein Rh is resistance at a high state and Rl is resistance at a low state.

The graph 250 of FIG. 4 serves merely as an example to convey the difference in TMR or percentage increase as the RA increases. For instance, at an RA of 2 ohm-micro-meters squared, the TMR is 100% while at a RA of 10, the TMR is 150% where the thickness of the barrier layer of the MTJ is between 14-24 Angstroms.

FIG. 5 shows relevant layers of a multi-state current-switching magnetic memory element 600 are shown, in accordance with another embodiment of the present invention. The memory element 600 is shown to include a bottom electrode 122 on top of which is shown formed a pinning layer 120 on top of which is shown formed a fixed layer 118, on top of which is shown formed a barrier layer 116, on top of which is formed a free layer 114, on top of which is shown formed a non-magnetic layer 112, as that shown in FIG. 1. As previously indicated, relative to FIG. 1, the MTJ 126 comprises the layers 114, 116 and 118. However, in the embodiment of FIG. 5, the MTJ 612, which is made of a free layer 602, a barrier layer 604 and a fixed layer 606, is smaller, in its planar dimension, than the MTJ 126 of FIG. 1, which causes the MTJ 612 to have a different resistance than that of the MTJ 126.

In FIG. 5, the free layer 602 is shown to be formed on top of the layer 112 and on top of the layer 602 is shown formed the layer 604, on top of which is shown formed the layer 606, on top of which is shown formed a pining layer 608, a top electrode 610. The MTJs 126 and 612 are shown separated by the layer 112. The MTJs 126 and 612 form the relevant parts of a stack of memory elements. In fact, while two MTJs are shown to form the stack of FIG. 5, other number of MTJs may be stacked for storing additional bits of information.

The difference in the planar dimension of the MTJs 612 to that of the MTJ 126 is approximately 1 to 10 and typically 1 to 3, in one embodiment of the present invention. The material for each of the layers of the memory element 600 may be the same as that of counterpart layers of the memory element 100. For example, the layer 602 is made of the same material as that of the layer 110 and the layer 604 is made of the same material as that of the layer 108 and the layer 606 is made of the same material as the layer 106 and the layer 608 is made of the same material as the layer 104. The top electrodes 610 and 102 are made of the same material. In another embodiment, the MTJ 612 may be larger, in size, in the same planar dimension, that the MTJ 126.

The operation of the embodiment of the embodiment of FIG. 5 is the same as that of FIG. 1.

FIG. 6 shows relevant layers of a multi-state current-switching magnetic memory element 700, in accordance with yet another embodiment of the present invention. The memory element 700 to include a bottom electrode 122 on top of which is shown formed a pinning layer 120 on top of which is shown formed a fixed layer 118, on top of which is shown formed a barrier layer 116, on top of which is formed a free layer 114, on top of which is shown formed a non-magnetic layer 112, as that shown in FIGS. 1 and 6. As previously indicated, relative to FIGS. 1 and 6, the MTJ 126 comprises the layers 114, 116 and 118. However, in the embodiment of FIG. 6, the MTJ 714, which is shown to comprise a free layer 706, a barrier layer 708 and a fixed layer 710, is shown to be smaller in its planar dimension than the MTJ 126 causing the MTJ 710 to have a different resistance than that of the MTJ 126.

The MTJs 126 and 714 are shown separated by the layers 702 and 704. Although the layer 704 serves to pin the layer 706 while the layer 702 serves to isolate the MTJ 126 and is an amorphous only to the layer 114. The layer 702, in one embodiment of the present invention, is made of two non-magnetic layers, such as Ta and/or an amorphous alloy, the same as Nickel-niobium (NiNb) or nickel-phosphorus(NiP). The MTJs 126 and 612 form the relevant parts of a stack of memory elements. In fact, while two MTJs are shown to form the stack of FIG. 5, other number of MTJs may be stacked for storing additional bits of information.

The difference in the planar dimension of the MTJs 714 to that of the MTJ 126 is 1 to 10, and typically 1 to 3 in one embodiment of the present invention. The material for each of the layers of the memory element 700 may be the same as the counterpart layers of the memory element 100 or that of the memory element 600. For example, the layer 710 is made of the same material as that of the layer 110 and the layer 708 is made of the same material as that of the layer 108 and the layer 706 is made of the same material as the layer 106 and the layer 704 is made of the same material as the layer 104. The top electrodes 712 and 102 are made of the same material. In another embodiment, the MTJ 714 may be larger, in size, in the same planar dimension, that the MTJ 126.

FIG. 7 shows relevant layers of a multi-state current-switching magnetic memory element 800, in accordance with still another embodiment of the present invention. In FIG. 7, the memory element 800 is shown to include a bottom electrode 802 on top of which is shown formed a pinning layer 804 on top of which is shown formed two fixed layers on either side thereof. That is, a fixed layer 806 is shown formed on one side of the layer 804 and a fixed layer 808 is shown formed on an opposite side of the layer 804.

In FIG. 7, two MTJs are shown formed on either side or top of the layer 804. Namely, an MTJ 820 is shown formed on one side of the layer 804 and another MTJ 822 is shown formed on an opposite side of the layer 804. The MTJ 820 includes the fixed layer 806, which is formed on top of the layer 804 and the barrier layer 810 shown formed on top of the layer 806 and the free layer 812 shown formed on top of the layer 810. The MTJ 822 is shown to include the fixed layer 808, which is formed on top of the layer 704 and the barrier layer 814, which is shown formed on top of the layer 808 and the free layer 816, which is shown formed on top of the layer 814. A top electrode 818 is shown formed on top of the MTJs 820 and 822 or more specifically on top of the layers 812 and 816. The top electrode 818 is typically made of two layers, such as Ta and a conductive, non-magnetic material.

In forming the memory element 800, the layer 804 is formed on top of the bottom electrode and the layers of the MTJs 820 and 822 are formed on top of the layer 804 and on top of the MTJs 820 and 822 is formed the top electrode 818. The layers of the MTJs 820 and 822 are formed uniformly and continuously on top of the layer 804 and a trench 824, which is basically an empty space or hole is formed, prior to depositing the top electrode 818, by etching through the layers of the MTJs 820 and 822. In this manner, the fixed layers of the MTJs 820 and 822 are the same layer prior to etching and the barrier layers of the MTJs 820 and 822 are the same layer prior to etching and the free layers of the MTJs 820 and 822 are the same layer prior to etching.

In one embodiment of the present invention, the trench 824 is filled with a dielectric material, such as silicon dioxide (SiO2) or silicon nitride (SiNx) to enhance stability.

After etching, the top electrode 818 is deposited or formed on top of the MTJs 820 and 822. The embodiment of FIG. 7, as the embodiments of FIGS. 6, 5 and 1 store two bits of information, on bit in each MTJ. Thus, the MTJ 820 is for storing one bit and the MTJ 822 is for storing another bit of information. However, more bits may be stored by adding MTJs. In FIG. 7, additional MTJs may be added on top of the layer 804 or the MTJs 820 and 822. With the addition of MTJs, beyond that which is shown in FIG. 7, additional notches or spaces are formed between the MTJs, such as the space or notch 824.

Table 2 shows certain exemplary characteristics of the embodiment of FIG. 7. It should be noted that similarly, Table 1 shows certain exemplary characteristics of the embodiments of FIGS. 1, 5 and 6.

For example, in Table 2, under the "Total R" column, there is shown the resistance at each state of the memory element 800, such as the state 1, the state 2, the state 3 and the state 4. As previously noted, each state represents a binary value such that four states, and represented by two bits are stored. The programming current, in micro amps, i.e. the current needed to program the memory element 800 to a given state, is indicated in the last column of Table 2, under the label "Prog I".

In an alternative embodiment of the present invention, a non-uniform switching based non-volatile magnetic memory element, such as the non-uniform switching based non-volatile magnetic memory element 100 disclosed in U.S. patent application Ser. No. 11/674,124 entitled "Non-Uniform Switching Based Non-Volatile Magnetic Base Memory", filed on Feb. 12, 2007, may be employed to replace the MTJs of the various embodiments shown and discussed herein. For example, the MTJ 124 or the MTJ 126 may be replaced with a non-uniform switching based non-volatile magnetic memory element. Other MTJs discussed herein may also be replaced with non-uniform switching based non-volatile magnetic memory element. This advantageously further reduces the requisite switching current to enhance system performance.

FIG. 8 shows a program/erase circuit for programming and/or erasing the memory elements of the various embodiments of the present invention. In FIG. 8, a current source 902 is shown coupled to a current mirror circuit 904, which is shown coupled to the switch 906, which is, in turn, shown coupled to the switch 908, which is shown coupled to the multi-state current-switching magnetic memory cell 914, which is shown coupled to the switch 916. Further shown in FIG. 8, a current source 918 is shown coupled to a current mirror circuit 920 and further shown coupled to Vcc on an opposite end thereto. The circuit 920 is further shown coupled to the switch 910.

The circuit 904 is shown to include a P-type transistor 922, a P-type transistor 924 and a P-type transistor 926. The source of each of the transistors 922, 924 and 926 are shown coupled to Vcc. Vcc is at a predetermined voltage level that is higher than ground. The gate of the transistor 922 is shown coupled to the current source 902 and the opposite side of the current source 902 is shown coupled to ground. The drain of the transistor 922 is shown coupled to its gate as well as to the gate of the transistor 924 and the gate of the transistor 926. The drains of the transistors 924 and 926 are shown coupled to the switch 906. The memory cell 914 is shown to include an MTJ 910, an MTJ 912 and an access transistor 940. The MTJ 912 is shown coupled in series to the MTJ 912, which is shown coupled to the drain of the transistor 940. The gate of the transistor 940 is shown coupled to the word line 942. The word line 942 selects a memory cell The source of the transistor 940 is shown coupled to the switch 916.

The circuit 920 is shown to include an N-type transistor 928, an N-type transistor 930 and an N-type transistor 932. The drains of the transistors 928, 930 and 932 are shown coupled to ground The gate of the transistor 932 is coupled to the current source 918 and is further coupled to the drain of the transistor 932 and is further coupled to the gate of the transistor 930 as well as to the gate of the transistor 928. The drain of the transistors 930 and 928 are shown coupled to the switch 910.

Each of the switches 908 and 916 are shown operative to switch between two states, a program state and an erase state. The switches 906 and 910 are shown operative to switch between two states.

The MTJs 910 and 912 are similar to the MTJs of previous figures, such as those depicted in FIGS. 1 and 6. In an alternative embodiment, the MTJs 910 and 912, coupled in parallel, would be similar to the MTJs shown in FIG. 7. Each MTJ 910 and 912 possesses a resistance of a different or unique value. The difference in their resistance results from the difference in the aspect ratio or size or anisotropy of the MTJs.

The size of the transistor 926 is greater than the size of the transistors 922 and 924. Similarly, the size of the transistor 928 is greater than the size of the transistors 930 and 932. In one embodiment of the present invention, the size difference of the foregoing transistors is 4 to 1. To explain the operation of programming, an example is provided with fixed values but it should be noted that these values may be altered without departing from the scope and spirit of the present invention.

In operation, to program the memory cell 914 to a state 1, a current of level of 50 micro Amps is applied by the current source 902 to the circuit 904, which is amplified to 4× the current level or 200 microAmps, as shown in 1 because the transistor 926 is able to drive this level of current. This causes the switch 906 to switch to the state indicated at 944. The switch 908 is set to 'program' state, as is the switch 916, which causes the 200 micro amp current to flow through the MTJs 910 and 912 and the transistor 940 is selected by raising the voltage on the word line 942. This results in programming of state 1. The magnetic moment of the free layers of the MTJs 910 and 912 will be caused to be aligned with the magnetic moment of that of their respective fixed layers. This results in the lowest resistance of the memory cell 914, as indicated in Table 1.

In programming the memory cell 914 to a state 2, a current of level of 50 micro Amps is applied by the current source 918 to the circuit 920, which is the same current level as that generated by the circuit 920. The current level for state 2 is indicated in Table 1. The switch 910 is caused to be switched to the state indicated at 948. The switches 908 and 916 are both set to 'erase' state, which causes the 50 micro amp current to flow through the MTJs 910 and 912 and the transistor 940 is selected by raising the voltage on the word line 942. This results in programming of state 2. The magnetic moment of the free layer of the MTJ 910 is caused to be switched to an anti-parallel state or a state that is in opposite to being aligned with its respective fixed layer. The MTJ 912 remains in the state it was in at state 1. The reason for this is, that in one embodiment of the present invention, with the aspect ratio of the MTJ 912 being higher than that of MTJ 910, it is prevented from switching. This results in the resistance of the memory cell 914 indicated in Table 1.

In programming the memory cell 914 to a state 3, a current of level of 50 micro Amps is applied by the current source 918 to the circuit 920, which causes the current level, generated by the transistor 928 to be 4 times that of the level of the current source, or 200 micro amps. The current level for state 3 is indicated in Table 1. The switch 910 is caused to be switched to the state indicated at 950. The switches 908 and 916 are both set to 'erase' state, which causes the 200 micro amp current to flow through the MTJs 910 and 912 and the transistor 940 is selected by raising the voltage on the word line 942. This results in programming of state 3. The magnetic moment of the free layers of the MTJs 910 and 912 are caused to be switched to an anti-parallel state relative to their respective fixed layers. This results in the resistance of the memory cell 914 to be that indicated in Table 1.

To program the memory cell 914 to a state 4, a current of level of 50 micro Amps is applied by the current source 902 to the circuit 904, which is the current level of the circuit 904 and that which is indicated in Table 1 for state 4. This causes the switch 906 to switch to the state indicated at 946. The switch 908 is set to 'program' state, as is the switch 916, which causes the 50 micro amp current to flow through the MTJs 910 and 912 and the transistor 940 is selected by raising the voltage on the word line 942. This results in programming of state 4. The magnetic moment of the free layer of the MTJ 910 will be caused to be aligned with the magnetic moment of that of its respective fixed layer. The MTJ 912 remains in its anti-parallel state, the reason for this is due the difference in the aspect ratios of the two MTJs as discussed hereinabove. This results in a resistance of the memory cell 914 indicated in Table 1.

FIG. 9 shows a read circuit for reading the memory elements of the various embodiments of the present invention. FIG. 9 is shown to include a memory cell 1002 coupled to a sense amplifier circuit 1004, which is shown coupled to a reference circuit 1006. The memory cell 1002 is shown to include an access transistor 1008, an MTJ 1010 and an MTJ 1012. The transistor 1008 is shown to have a drain, a source and a gate. The gate of the transistor 1008 is shown coupled to a word line 1014, the drain of the transistor is shown coupled to ground and the source of the transistor is shown coupled to the MTJ 1010.

It should be noted that wherever values are indicated herein, they are to merely serve as examples with the understanding that other suitable values are anticipated. It is further noted that while reference is made to an N-type or P-type transistor, either type or other suitable types of transistors may be employed, as the type of transistor indicated in the foregoing embodiments, merely serve as examples.

The circuit 1006 is shown to include a number of state reference circuits, indicated as state reference circuit 1020, 1022 and 1024. Each of the circuits 1020-1024 includes an access transistor and a reference resistor For example, the circuit 1020 is shown to include a reference resistor 1026 coupled on one side to the circuit 1004 and Vcc and on the other side to the drain of an access transistor 1028. The gate of the transistor 1028 is shown coupled to a select signal, namely select 1 signal 1040.

Similarly, the circuit 1022 is shown to include a reference resistor 1030 coupled on one side to the circuit 1004 and Vcc and on the other side to the drain of an access transistor 1032. The gate of the transistor 1032 is shown coupled to a select signal, namely the select 2 signal 1042. The circuit 1024 is shown to include a reference resistor 1034 coupled on one side to the circuit 1004 and Vcc and on the other side to the drain of an access transistor 1036. The gate of the transistor 1044 is shown coupled to a select signal, namely the select 3 signal 1044.

The MTJs 1010 and 1012, as stated relative to FIG. 8, are similar to the MTJs of the embodiments of the present invention except that in the case of FIG. 7, the MTJs of the read circuit would be coupled in parallel rather than in series, shown in FIG. 9.

During a read operation, the memory cell 1002 is selected by raising the voltage of the word line 1014. The circuit 1004 compares the total resistance of the MTJs 1010 and 1012 with the resistances of the reference resistors of the state reference circuits. For example, the resistance of the MTJs 1010 and 1012 (collectively or added together) is compared to the resistance of the resistor 1026 and if it is determined to be less, the state of the memory cell 1002 is declared as binary value '00' or perhaps, state 1. However, if the resistance of the MTJs 1010 and 1012, collectively, is determined to be higher than that of the resistor 1026, the former is then compared to the resistance of the resistor 1030 and there again, if the resistance of the MTJs 1010 and 1012 is less than the resistor 1030, the state 2 or binary value '01'. If the resistance of the MTJs 1010 and 1012 is determined to be greater than the resistor 1030, the resistance of the MTJs 1010 and 1012 is compared to the resistance of the resistor 1034 and if the resistance of the former is determined to be lower, the state 3 or binary value '10' is declared (or read), otherwise, the state 4 or binary value '11' is declared.

The select signal of each of the circuits 1020-1024 are used to select the corresponding circuit. For example, to compare the resistance of the MTJs to the resistance of the resistor 1026, the signal 1040 is activated thereby turning on the transistor 1028. In the meanwhile, the remaining transistors of the circuit 1006 are off. Similarly, to compare the resistance of the MTJs to the resistance of the resistor 1030, the signal 1042 is activated thereby turning on the transistor 1032. In the meanwhile, the remaining transistors of the circuit 1006 are off. To compare the resistance of the MTJs to the resistance of the resistor 1034, the signal 1044 is activated thereby turning on the transistor 1036. In the meanwhile, the remaining transistors of the circuit 1006 are off.

Examples of resistance values of the reference resistors are averages of the resistances of the MTJs 1010 and 1012. For example, the resistance of the resistor 1026 is the average of the resistances of the MTJs 1010 and 1012 at the states 1 and 4, as indicated in Table 1. The resistance of the resistor 1030 is the average of the resistances of the MTJs 1010 and 1012 at the states 2 and 4, as indicated in Table 1. The resistance of the resistor 1034 is the average of the resistances of the MTJs 1010 and 1012 at the states 2 and 3, as indicated in Table 1. For example, in one embodiment of the present invention, the resistor 1026 has a resistance of 3.5 kilo-ohm, which is the average of 3 and 4 kilo-ohms. The resistance of the resistor 1030 is 4.5 kilo-ohms, which is the average of 5 and 4 kilo-ohms and the resistance of the resistor 1034 is 5.5 kilo-ohms, which is the average of 5 and 6 kilo-ohms.

In alternative embodiments of the present invention, the MTJs (or memory elements) disclosed in U.S. patent application Ser. No. 11/674,124 entitled "Non-Uniform Switching Based Non-Volatile Magnetic Base Memory", filed on Feb. 12, 2007, may be employed in the embodiments of FIGS. 8 and 9 herein.

It should be noted that the objects of the drawings or figures discussed and presented herein are not necessarily drawn to scale.

Referring now to FIG. 10(a), memory element 1300 is comprised of a bottom electrode 1310, seed layer 1312, pinning layer 1314, fixed layer 1316, barrier layer 1318, non-uniform free layer 1320, cap layer 1322, and top electrode 1324 in an embodiment of the present invention. Fixed layer 1316, barrier layer 1318, and non-uniform free layer 1320 together comprise MTJ 1340. In the fabrication process, memory element 1300 is assembled such that top electrode 1324 is formed on cap layer 1322, cap layer 1322 is formed on non-uniform free layer 1320, non-uniform free layer 1320 is formed on barrier layer 1318, barrier layer 1318 is formed on fixed layer 1316, fixed layer 1316 is formed on pinning layer 1314, seed layer 1312 is formed on bottom electrode 1310, and bottom electrode 1310 is formed on a metal line, for example, a copper (Cu) or aluminum (Al) line.

The pinning layer 1314 is substantially made of an antiferromagnetic material. In an exemplary embodiment, the pinning layer 1314 is made of iridium manganese (IrMn), platinum manganese (PtMn) or nickel manganese (NiMn) containing one or more of the elements from the following material: chromium (Cr), nickel (Ni), or molybdenum (Mo).

Memory element 1350 of FIG. 10(b) shows an alternative configuration of an embodiment of the present invention, which operates in substantially the same manner as memory element 1340. For the subsequent discussion of the present invention, memory element 1340 will be primarily referred to, but it is understood that this is for the sake of simplicity and brevity, and that any discussion of structure/purpose/function, unless otherwise noted, also applies to the function of memory element 1350.

Electrode layers 1310 and 1324 are composed substantially of a non-magnetic conductive layer, such as, for example, tantalum, in one embodiment of the present invention. Electrode layers 1310 and 1324 function to pass current through the memory element, from one electrode to the other; i.e., current 1303 passes from bottom electrode 1310 through the intermediate layers to top electrode 1324, or current 1304 passes from top electrode 1324 through the intermediate layers to bottom electrode 1310. The direction in which current is passed depends upon the desired state of memory element 1340, which will be discussed in more detail shortly, in reference to programming and erasing memory element 1300.

Cap layer 1322 is produced by a vacuum deposition process. Cap layer 1322 functions to prevent intermixing between the top electrode layer 1324 and non-uniform free layer 1320, of memory element 1300; or, similarly, to prevent intermixing between top electrode layer 1324 and pinning layer 1314, of memory element 1301. Cap layer 1322 may also function to obtain a more non-uniform and more broad distribution of grain sizes in non-uniform free layer 1320, as will be discussed shortly.

Barrier layer 1318 and fixed layer 1316 are formed, and function, in the same manner as disclosed for barrier layer 24 and fixed layer 22, respectively, of memory element 10 of FIGS. 4, 6, and 8(a) in U.S. patent application Ser. No. 11/776,692, entitled "Non-Volatile Magnetic Memory Element With Graded Layers," by Ranjan, et al, filed Jul. 12, 2007.

The resistance values for memory element 1300 are dependent upon the thickness of the MgO Barrier layer 1318, and the state of the memory element—as shown in Table 3. Under Scenario 1, where barrier layer 1318 is a 1.2 nm thick layer of MgO, the resistance varies, depending upon the state (00, 01, 10, or 11), estimated to be from 694Ω, up to 1736Ω. As is shown in Scenarios 2 and 3, as the MgO thickness of barrier layer 1318 becomes greater, so does the resistance of memory element 1300 in all of its potential states. Under Scenario 1, the resistance difference between successive states is a consistent 300-400Ω, and state IV (11) has a resistance of roughly only 1100Ω more than state I (00). Similarly, under Scenario 3, the resistance of MTJ 1340 increases consistently, but in much larger increments of roughly 2000Ω per successive state. Consequently, in state IV (11) under Scenario 3, the resistance of MTJ 1340 is almost 6000Ω more than that of state I (00). Such differences in the resistance range must be taken into consideration when designing the read circuitry of memory element 1300, as well as when the memory element may be designed to store more than four states, as will be discussed shortly.

The roles of seed layer 1312 and cap layer 1322 in memory elements 1300 and 1301 may be very different. In memory element 1301, the seed layer 1312 is selected for different properties compared to the seed layer of memory element 1300. Seed layer 1312 in memory element 1301 is selected primarily from a group of substantially amorphous alloys, such as nickel phosphorous (NiP), nickel boron (NiB), nickel niobium (NiNb), nickel zirconium (NiZr), nickel tungsten (NiW), or any combination of these compounds which contains less than 20 molar percent of oxides and nitrides of aluminum (Al), silicon (Si), titanium (Ti), tantalum (Ta), and tungsten (W). In addition, process conditions are chosen that will give a very broad grain size distribution of seed layer 1312. Ideal process conditions for the vacuum deposition process of seed layer 1312, using RF- or DC- magnetron, or similar, are, for example, less than 1% by volume of $H_2O$ or $O_2$, and high argon pressure.

The role of the seed layer 1312 for the memory element 1300 in the embodiment in FIG. 10(a) is also to result in a very non-uniform grain structure in the non-uniform free layer 1320. The seed layer is typically an alloy of one or two elements having largely different melting points and/or having strong affinity to form stable compounds. Some examples of such seed layer is NiX—P (where X is one or more of Cr, Nb, Ta, Mo, W, Cu, Zn, Ti, Al), Al—Y (where Y is one or more of Ta, W, Ti, Nb, Zr, Si). Ideally the seed layer 1312 is so chosen as to provide epitaxial growth for the subsequent layer 1314 leading to the transfer of non-uniform grain size through the subsequent layers, most importantly the non-uniform free-layer 1320. Additionally, the process conditions are chosen that will give a very broad grain size distribution of seed layer 1312. Ideal process conditions for the vacuum deposition process of seed layer 1312, using RF- or DC- magnetron, or similar, are, for example, less than 1% by volume of $H_2O$ or $O_2$, and high argon pressure.

The role and choices of cap layer 1322 is also different between memory element 1300 and memory element 1301. Cap layer 1322 of memory element 1300 serves a much more significant function than that of cap layer 1322 of memory element 1301, and consequently the materials chosen for formation of cap layer 1322 of memory element 1300 are more limited. This is because the cap layer 1322 of memory element 1300 facilitates the amorphous to crystalline transformation of non-uniform free layer 1320 in conjunction with fixed layer 1316 during the annealing process of CoFeB/MgO/CoFeB type magnetic tunnel junctions. This is required to obtain high TMR (Tunneling magneto-resistance) which is essential for getting better selectivity between various states. Cap layer 1322 of memory element 1301 may be comprised of any of the following: Ta, TiW, Ti, Cr, and alloys thereof. Cap layer 1322 of memory element 1300 may be comprised of a substantially amorphous layer, such as nickel niobium (NiNb), nickel zirconium (NiZr), nickel niobium zirconium (NiNbZr), nickel silicon niobium (NiSiNb), or nickel silicon zirconium (NiSiZr).

Figure 11B:
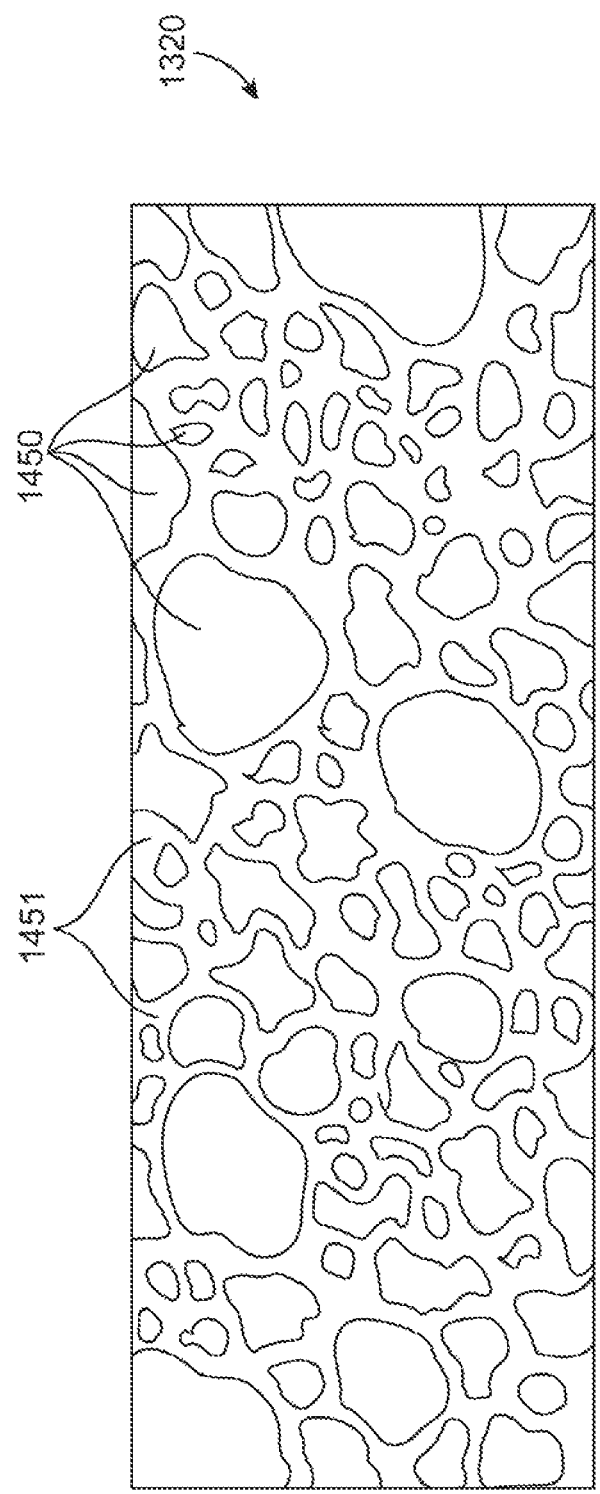

Referring now to FIGS. 11(a) and 11(b) an illustration of non-uniform free layer 1320's crystalline structure is shown, as seen under a scanning or transmission electron microscope (SEM or TEM). Non-uniform free layer 1320 is comprised of a uniform distribution of broadly varying non-uniformly sized grain structures. FIG. 11(a) shows a simplified view of non-uniform free layer 1320, where the layer is comprised of three sizes of crystal structures—large grains 1402, medium grains 1404, and small grains 1406. In one embodiment, small grains 1406 are approximately 0-6 nm in diameter, medium grains 1404 are approximately 6-10 nm in diameter, and large grains 1402 are approximately greater than 11 nm in diameter.

FIG. 11(b) shows a more realistic view of non-uniform free layer 1320. In FIG. 11(b) the grains are randomly distributed, rather than the regular pattern of FIG. 11(a); and have an erratic grainy conformation, rather than the equally spaced circular aesthetic of FIG. 11(a). In an embodiment of the present invention non-uniform free layer 1320 can be formed using a variety of methods, such as, for example, vacuum deposition or gas sputtering methods. In one embodiment of the present invention, non-uniform free layer 1320 is comprised substantially of a cobalt iron boron (CoFeB) and chromium (Cr) in combination with tantalum (Ta). Each grain is formed primarily of CoFeB, with the Cr forming only as a thin outer layer of each grain, as better illustrated in FIG. 14(b). In FIG. 11(b), magnetic grains 1401 are formed in varying sizes and comprised of CoFeB. Magnetic grains 1450 include small grains 1406, medium grains 1404, and large grains 1402 of FIG. 11(a). The non-magnetic shell 1451 of non-uniform free layer 1320, formed between grains 1450, is comprised of chromium. Because chromium is non-magnetic, it is an exemplary material for use as a surrounding material of the CoFeB crystal structures of non-uniform free layer 1320.

Crystal grain structures 1402, 1404, and 1406 are grown in a manner such that the size of the grains is random, and the distribution uncontrolled. In one embodiment, when the alloy of non-uniform free layer 1320 contains greater than 10 atomic percent of Cr and Ta, chromium atoms bind to other chromium atoms, and a thin layer of chromium is formed, ultimately forming the non-magnetic outer shell 1451, which serves as a boundary between grains 1450, as better seen in FIG. 14(b). In yet another embodiment, non-uniform free layer 1320 is comprised of CoFeB with oxides and nitrides of $SiO_2$, $TiO_2$, $Ta_2O_5$, $WO_3$, $Al_2O_3$, TiN, TaN, WN. In these cases, neighboring CoFeB grains will also be magnetically isolated from each other, because oxides and nitrides tend to segregate at the grain boundary regions due to low immiscibility in the CoFeB, and thereby be exchange decoupled from the neighboring grains. This ensures that the CoFeB contents of any single grain are completely isolated from the CoFeB contents of any neighboring grains. Grain isolation, together with the fact that chromium, or oxides and nitrides, are non-magnetic, results in weak exchange coupling between the grains of non-uniform free layer 1320. Weak exchange coupling between grains ensures independent switching of the magnetic grains of the non-uniform free-layer, which together with a broad grain size distribution results in a large switching current distribution. A large switching current distribution is required to achieve the multiple, distinct states, of memory elements 1300 and 1301.

For example, the application of −200 μA of current only flips the magnetic moments of small grains 1406, of FIGS. 11(a) and 12, when exchange coupling forces are minimal to non-existent. If present, exchange coupling forces would induce the magnetic moments of medium grains 1404 and large grains 1402, that are proximous to small grains 1406 with presently flipping magnetic moments, to also flip upon the application of −200 μA.

Referring now to FIG. 13, small grains 1406, medium grains 1404, and large grains 1402 each represent approximately equal percentages by volume in this example of non-uniform free layer 1320 in an embodiment of the present invention (i.e., non-uniform free layer 1320 is comprised of 33% by volume of small grains 1406, 33% by volume of medium grains 1404, and 33% by volume of large grains 1402).

This results in approximately equal portions of non-uniform free layer 1320 switching with the application of each switching current shown in Table 4. Line 1602 shows that with the application of $I_{sw1}$ (switching current 1, or −200 μA in Table 4), approximately 33% by volume of the magnetic moments of grains in the non-uniform free layer have flipped.

Similarly, $I_{sw2}$ and $I_{sw3}$ (corresponding to −300 and −400 μA in Table 4, respectively) each also flip the magnetic moments of 33% by volume of grains in the non-uniform free layer. This effectively equalizes a variable, across states, which affects the varying resistance of MTJ 1340, thereby simplifying the read circuitry, used for determining the binary value held within memory element 1300, which will be discussed in more detail shortly.

Because of the large impact that a small change in grain diameter has on grain volume, there are far more small grains 1406 than large grains 1402 in non-uniform free layer 1320. This is better shown by plot 1601 of FIG. 13, where roughly 85% of the grains (small grains 1402) switch with the application of $I_{sw1}$, 10% of the grains (medium grains 1404) switch with the application of $I_{sw2}$, and 5% of the grains (large grains 1406) switch with the application of $I_{sw3}$.

Referring now to FIG. 12, non-uniform free layer 1320's magnetic moment is capable of being in one of four states at any time. These four states are responsible for, and correspond to, the four states that memory element 1300 can have and the resulting binary values—view 1501 shows state I, or 00; view 1502 shows state II, or 01; view 1503 shows state III, or 10; and view 1504 shows state IV, or 11. The state of the magnetic moment of non-uniform free layer 1320 is read in reference to fixed layer 1316, fixed layer 1316 having a fixed magnetic moment. This is better illustrated with Table 4, shown below, where the starting state is when the magnetic moments of the fixed layer and the non-uniform free layer are parallel. Conversely, another sequence of magnetic states might begin with the magnetic moments of the fixed layer and the non-uniform free layer being anti-parallel, in which case the direction of applied current, for changing the state of the memory element, is reversed.

For the sake of simplicity, in this discussion of the present invention, we define the current flowing from the free layer into the fixed layer (current 1304 of memory element 1300, or current 1303 of memory element 1301) as positive current direction; and negative current direction as the flow of current from the fixed layer to the free layer (current 1303 of memory element 1300, and current 1304 of memory element 1301).

Referring now to Table 4, state I (or 00) corresponds to view 1501 of non-uniform free layer 1320 of FIG. 12. In state I, the magnetic moment of non-uniform free layer 1320 is completely aligned within itself, as well as fixed layer 1316—in this example, to the right. Non-uniform free layer 1320 is placed into this state, state I, upon the application of 400 micro-amps (μA) of current 1304—which is applied at top electrode 1324, and travels through the intermediate layers to bottom electrode 1310—to the memory element. The program and erase circuitry responsible for the application of varying amount of current, and consequentially the programming of the memory elements will be discussed in more detail shortly.

Non-uniform free layer 1320, and consequentially memory element 1300, are placed into state II, shown in view 1502, upon the application of 200 μA of current to bottom electrode 1310, which travels through the intermediate layers to top electrode 1324. The 200 μA of current applied to bottom electrode 1310 is referred to as −200 μA in Table 4 because of the application direction (bottom electrode to top electrode) and anti-parallelizing effect it has. As a result of the application of the −200 μA, the direction of the magnetic moments of the smaller grains, grains 1406 of FIG. 12, have reversed, as shown in view 1502. In view 1502, the −200 μA is enough current to invert small grains 1406 of non-uniform free layer 1320, because small grains 1406 have smaller magnetic moment that is more easily reversed than the magnetic moment of the larger grains—medium grains 1404, and large grains 1402. The reversal of the magnetic moments of small grains 1406 is illustrated in view 1502 by the arrows of small grains 1406 pointing to the left; and similarly, in Table 4, a small arrow (small grains 1406) is pointing left, while a large remainder of the magnetic moments, the magnetic moments of medium grains 1404 and large grains 1402, are still pointing in their original directions.

Referring now to column 3 of Table 4 and view 1503 of FIG. 12, −300 μA of current has been applied to memory element 1300, resulting in state III, or binary value 10. The 300 μA of current, from bottom electrode 1310 to top electrode 1324, is capable of inverting the direction of the magnetic moments of the medium size grains 1404 in addition to the magnetic moments of small grains 1406. In Table 4 this is illustrated by a larger arrow, representing small grains 1406 and medium grains 1404, pointing to the left, anti-parallel to fixed layer 1316. The smaller arrow represents the magnetic moment of the large grains 1402, still parallel with the fixed layer, pointing right.

Finally, the application of −400 μA of current, shown in Table 4 and view 1504 of FIG. 12, is enough to invert the direction of the magnetic moments of large grains 1402 in addition to the direction of the magnetic moments of medium grains 1404 and small grains 1406. Now that the direction of the magnetic moments of all of the grains of non-uniform free layer 1320 have been inverted, non-uniform free layer 1320 is in a completely anti-parallel state to fixed layer 1316, the binary state 11.

The proper formation of non-uniform grain structure of non-uniform free layer 1320, depends upon the crystalline structure of neighboring seed layer 1312. Seed layer 1312 is formed prior to the formation of non-uniform free layer 1320, and non-uniform free layer 1320 subsequently builds off seed layer 1312, with any structural and crystalline patterns found within seed layer 1312 carrying over into the crystalline structure of non-uniform free layer 1320. The formation of seed layer 1312 is selected in order to create the widest distribution of non-uniform grains within the subsequently formed non-uniform free layer. The ideal structure of seed layer 1312 is, like non-uniform free layer 1320, one of a wide distribution of non-uniformly sized grains. Exemplary materials used to form seed layer 1312 are alloys of nickel phosphorous (NiP), nickel boron (NiB), nickel niobium (NiNb), nickel zirconium (NiZr), nickel tungsten (NiW), or any combination of these compounds which contains less than 20 molar percent of oxides and nitrides of aluminum (Al), silicon (Si), titanium (Ti), tantalum (Ta), and tungsten (W), as described earlier. Additionally, during deposition of seed layer 1312, the $O_2$ and $H_2O$ present within the sputtering gas, such as argon, xenon, or krypton, and high sputtering pressure assist to form a non-uniform seed layer.

As discussed earlier sections current may be passed through memory element 1300 in the direction of current 1304, from top electrode 1324 through MTJ 1340 and other intermediate layers to bottom electrode 1310; or, from bottom electrode 1310, through the intermediate layers and MTJ 1340, to top electrode 1324 as indicated by current 1303. The amount of current applied to memory element 1300, and the direction that the current is passed in, is dependent upon the desired state, or stored binary value, of memory element 1300. For example, if during use memory element 1300 was intended to store the binary value 01, then the programming circuit would pass 200 μA of current from bottom electrode 1310 to top electrode 1324 (−200 μA).

The range of switching currents which control the state of any given memory element are dependent not only upon the composition of the memory element, but also upon the physical dimensions of the memory element, as shown in Table 5. As the footprint (the area in nanometers-squared) of the memory element becomes larger, more current is necessary to switch the memory element to its other states. For example, a memory element with a 60 nm×120 nm footprint is estimated to have a range of switching currents from 80 μA for switching current 1 ($I_{sw1}$), to 160 μA for switching current 3 ($I_{sw3}$), with a stepwise delineation shown in more detail in Table 5. In comparison, a memory element with a 100 nm×150 nm footprint is estimated to have a range of switching currents from 100 μA to 300 μA, also shown in Table 5.

Referring now to FIG. 14, in an alternative embodiment of the present invention, the sizes of the crystals of non-uniform free layer 1320 are further divided into more than three bins (i.e., more than just small, medium and large). For example, the formation of non-uniform free layer 1320 in a manner allowing the crystals to be divided into seven bins would result in 8 possible states, and the representation of 3 bits per memory element (000 through 111). FIG. 14 shows the correlation of switching current to the percentage by volume of non-uniform free layer 1320 that is switched, where the range of grain sizes is further divided into seven bins of grain sizes. Each grain size bin represents an approximately identical percentage by volume of non-uniform free layer 1320 (i.e., non-uniform free layer 1320 is comprised of 14% by volume of the smallest grain bin, which includes all grains less than 4 nm in diameter; up to 14% by volume of the largest grain bin, which includes all grains over 15 nm in diameter). Plot 1701 of FIG. 14 shows the number of grains that switch with the application of each switching current. The largest number of grains (the smallest grains) switch upon the application of $I_{sw1}$ (switching current 1), and the smallest number of grains (the largest grains) switch with the application of $I_{sw7}$. Plot 1702 shows the cumulative volume of free layer 1320 grains that are switched in any of the eight magnetic states of an alternative embodiment of the present invention. With the application of switching current 1, the magnetic moment of approximately 14% of the grains by volume of non-uniform free layer 1320 are switched to be anti-parallel of fixed layer 1316, and with the application of switching current 7, approximately 100% of the grains of the non-uniform free layer are switched to be anti-parallel with the fixed layer.

In one embodiment of the present invention, the separation of grains into specific bins is done out by measuring the switching current distribution of a large group of memory elements, and then deciding the appropriate bins. A feed-back circuit may be used to ensure appropriate writing and reading tolerances are maintained between different, states and also to ensure the reliability of the product.

While the embodiments discussed so far refer to the longitudinal magnetic tunnel junctions where the magnetic moments of the free and fixed layers are substantially parallel to the substrate surface (in-plane orientation), the discussion also applies to the situation when the magnetic tunnel junction has a substantial perpendicular orientation. In such a case, it is likely that a different set of seed layers, which generate non-uniformity in the perpendicularly oriented non-uniform free layer through both dispersion in orientation and dispersion in grain size, will be necessary. The grains of the non-uniform free layer will again be weakly exchange coupled to enable switching of the individual grains of the non-uniform free layer.

The circuit used for the programming and erase functions of memory element 1300 is structurally and functionally the same as program/erase circuit 900 of FIG. 8, used to program MTJs 910 and 912 of U.S. patent application Ser. No. 11/678, 515, entitled "A High Capacity Low Cost Multi-State Magnetic Memory," by Ranjan, et al, filed Feb. 23, 2007.

Read operations of memory elements 1300 and 1301 are performed by a read circuit in substantially the same manner as that of read circuit 1000, of FIG. 9, and its read operation of MTJ 1010, as discussed U.S. patent application Ser. No. 11/678,515, entitled "A High Capacity Low Cost Multi-State Magnetic Memory," by Ranjan, et al, filed Feb. 23, 2007.

Although the present invention has been described in terms of specific embodiment, it is anticipated that alterations and modifications thereof will no doubt become apparent to those more skilled in the art. It is therefore intended that the following claims be interpreted as covering all such alterations and modification as fall within the true spirit and scope of the invention.

What is claimed is:

1. A method of programming a non-volatile magnetic memory element comprising:

applying a first level of switching current to a bottom electrode or a top electrode of a non-volatile magnetic memory element, the non-volatile magnetic memory element including a magnetic tunneling junction (MTJ) formed on top of the bottom electrode and having a fixed layer, a barrier layer and a non-uniform free layer, the non-uniform free layer having a magnetic moment that is switchable and having grains that are magnetic and of varying sizes and randomly distributed throughout the non-uniform free layer, each grain having a distinct magnetic moment, the first level of switching current corresponding to one of multiple logical states taken on by the non-volatile magnetic memory element;

the non-uniform free layer receiving the switching current when it flows through the non-volatile magnetic memory element to cause switching of the magnetic moment of the non-uniform free layer, the logical state of the non-volatile magnetic memory element being defined by the magnetic moment of the non-uniform free layer;

each grain of the non-uniform free layer switching substantially independently of the other grains of the non-uniform free layer, the magnetic moment of a substantial number of grains defining the magnetic moment of the non-uniform free layer;

switching the magnetic moment of the non-volatile magnetic memory element;

applying another level of switching current of the multiple levels of switching current, other than the first level, to the non-volatile magnetic memory element to cause switching of the non-volatile magnetic memory element to another logical states;

switching the non-volatile magnetic memory element to another logic state; and repeating the applying another level and switching steps to switch the non-volatile magnetic memory element to the multiple logical states.

2. The method of programming, as recited in claim 1, wherein the grains comprise of a first set of grains having a first size, a second set of grains having a second size and a third set of grains having a third size, each of the sets of grains responsive to a distinct level of the switching current flowing through the non-uniform free layer based on the size of the set of grains and wherein each of the set of grains switches its magnetic moment accordingly, wherein the non-volatile magnetic memory element takes on up to four logical states.

3. The method of programming, as recited in claim 2, wherein the first set of grains comprises substantially 85% of the grains and receives the first level of switching current and switches its magnetic moment accordingly and the second set of grains comprises substantially 10% of the grains and receives a second level of the switching current and switches its magnetic moment accordingly and the third set of grains comprises substantially 5% of the grains and receives a third level of switching current and switches its magnetic moment, the first size of the first set of grains being smaller than the second size of the second set of grains and the third size of the third set of grains and the second size of the second set of grains being smaller than the third size of the third set of grains.

4. The method of programming, as recited in claim 1, wherein a portion of the non-uniform free layer determining the logical state the non-volatile magnetic memory element takes on in that the size of the grains cause the non-uniform free layer to switch its magnetic moment when a predetermined switching current level flows through the non-uniform free layer.

5. The method of programming, as recited in claim 1, wherein the non-volatile magnetic memory element stores at least four logical states.

\* \* \* \* \*